US010668591B2

(12) United States Patent
Murachi et al.

(10) Patent No.: US 10,668,591 B2
(45) Date of Patent: Jun. 2, 2020

(54) SUBSTRATE CLEANING DEVICE, SUBSTRATE PROCESSING APPARATUS AND SUBSTRATE CLEANING METHOD

(71) Applicant: SCREEN HOLDINGS CO., LTD., Kyoto (JP)

(72) Inventors: Hiromi Murachi, Kyoto (JP); Ryuichi Yoshida, Kyoto (JP); Koji Nishiyama, Kyoto (JP); Toru Momma, Kyoto (JP); Chikara Sagae, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 22 days.

(21) Appl. No.: 15/697,775

(22) Filed: Sep. 7, 2017

(65) Prior Publication Data

US 2018/0071884 A1 Mar. 15, 2018

(30) Foreign Application Priority Data

Sep. 13, 2016 (JP) ................................ 2016-178818

(51) Int. Cl.
*B24B 29/02* (2006.01)
*H01L 21/67* (2006.01)
(Continued)

(52) U.S. Cl.
CPC .............. *B24B 29/02* (2013.01); *B08B 1/002* (2013.01); *B08B 1/02* (2013.01); *B08B 3/022* (2013.01); *B08B 7/04* (2013.01); *B08B 11/02* (2013.01)

(58) Field of Classification Search
CPC ......... H01L 21/67155; H01L 21/67161; H01L 21/67167; H01L 21/67173; H01L 21/67178; H01L 21/02013; H01L 21/02016; H01L 21/02024; H01L 21/02041; H01L 21/02043; H01L 21/02052; H01L 21/02054; H01L 21/02057; H01L 21/0209; H01L 21/02096;
(Continued)

(56) References Cited

U.S. PATENT DOCUMENTS 5,518,542 A * 5/1996 Matsukawa ............ B08B 1/007 118/232
6,151,744 A 11/2000 Ohtani et al. .................. 15/88.2
(Continued)

FOREIGN PATENT DOCUMENTS

JP 10-004072 A 1/1998
JP H 10-022242 A 1/1998
(Continued)

*Primary Examiner* — David G Cormier
(74) *Attorney, Agent, or Firm* — Ostrolenk Faber LLP

(57) ABSTRACT

A rotating substrate is cleaned by a polishing head and a cleaning brush. A first trajectory is formed by movement of the polishing head along a first path. A second trajectory is formed by movement of the cleaning brush along a second path. A region in which the first and second paths overlap with each other is defined as an interference region. The polishing head moves from a center towards an outer peripheral end of the substrate, and it is determined whether the polishing head has moved out of the interference region. At a time point at which it is determined that the polishing head has moved out of the interference region, the cleaning brush starts moving from the outer peripheral end towards the center of the substrate.

8 Claims, 15 Drawing Sheets

(51) Int. Cl.

| | |
|---|---|
| ***B08B 11/02*** | (2006.01) |
| ***B08B 3/02*** | (2006.01) |
| ***B08B 1/02*** | (2006.01) |
| ***B08B 1/00*** | (2006.01) |
| ***B08B 7/04*** | (2006.01) |

(58) Field of Classification Search

CPC ......... H01L 21/67046; H01L 21/67092; H01L 21/67219; H01L 21/302; H01L 21/304; B24B 29/02; B24B 37/04; B24B 37/042; B24B 37/07; B24B 37/105; B24B 37/107; B24B 41/047; B08B 1/002; B08B 1/008; B08B 7/04

See application file for complete search history.

(56) References Cited

U.S. PATENT DOCUMENTS

| | | | | |
|---|---|---|---|---|
| 2005/0183754 | A1 | 8/2005 | Kago et al. | 134/56 |
| 2008/0163899 | A1 | 7/2008 | Takiguchi et al. | 134/30 |
| 2009/0025155 | A1 | 1/2009 | Nishiyama et al. | 15/21.1 |
| 2009/0120472 | A1 | 5/2009 | Nishiyama et al. | 134/157 |
| 2009/0199869 | A1 | 8/2009 | Kago et al. | 134/6 |
| 2014/0102474 | A1 | 4/2014 | Takiguchi et al. | |
| 2015/0314339 | A1 | 11/2015 | Hirakawa et al. | 134/6 |
| 2016/0236239 | A1 | 8/2016 | Nishiyama | |
| 2016/0314958 | A1 | 10/2016 | Takiguchi et al. | |

FOREIGN PATENT DOCUMENTS

| | | | |
|---|---|---|---|
| JP | 2005-228961 | A | 8/2005 |
| JP | 2008-016781 | A | 1/2008 |
| JP | 2008-177541 | A | 7/2008 |
| JP | 2009-123800 | A | 6/2009 |
| JP | 2009-238861 | A | 10/2009 |
| KR | 10-0237761 | B1 | 1/2000 |
| KR | 10-2016-0100839 | A | 8/2016 |
| TW | 200913028 | A | 3/2009 |
| TW | 201607628 | A | 3/2016 |

* cited by examiner

ROTATION ANGLE OF ARM
TIME
θ1
θ2
γ
β
α
O
t0
t1
t2
t3
t4
t5
t6
t7
t8
t9
t10
t11

TIME POINT: t0

TIME POINT: t1

TIME POINT: t2, t3

TIME POINT: t4

TIME POINT: t5

TIME POINT: t6

TIME POINT: t8

TIME POINT: t9, t10
p1
p2
ph
if
cb
W
WC
WE
410
510

SUBSTRATE CLEANING DEVICE, SUBSTRATE PROCESSING APPARATUS AND SUBSTRATE CLEANING METHOD

BACKGROUND OF THE INVENTION

Field of the Invention

The present invention relates to a substrate cleaning device, a substrate processing apparatus and a substrate cleaning method for cleaning a substrate.

Description of Related Art

In a lithography process in manufacturing of a semiconductor device and the like, a coating film is formed by supply of a coating liquid such as a resist liquid onto a substrate. The coating film is exposed to exposure light and then developed, so that a predetermined pattern is formed on the coating film. Cleaning processing is performed on the substrate of which the coating film has not been exposed (see JP 2009-123800 A, for example).

In JP 2009-123800 A, a substrate processing apparatus having a cleaning drying processing unit is described. In the cleaning drying processing unit, the substrate is rotated while being horizontally held by a spin chuck. In this state, particles and the like adhering to a main surface of the substrate are cleaned away by supply of a cleaning liquid to the main surface of the substrate. Further, contaminants adhering to an entire back surface and an outer peripheral end of the substrate are removed by cleaning of the entire back surface and the outer peripheral end of the substrate by the cleaning liquid and a cleaning brush.

BRIEF SUMMARY OF THE INVENTION

A higher level of cleanliness of the back surface of the substrate is required in order to form an even finer pattern on the substrate. It is considered that the back surface of the substrate is cleaned by simultaneous use of a plurality of cleaning brushes in order to improve the cleanliness of the back surface of the substrate while a reduction in throughput is inhibited.

As one example of a method of cleaning the substrate using a plurality of cleaning brushes, it is described in JP 10-4072 A that a main surface of the substrate is cleaned while two cleaning brushes are respectively moved back and forth between a rotation center of the substrate and a peripheral portion of the substrate. In this cleaning method, operation patterns of the two cleaning brushes respectively are formed in advance by a user before the main surface of the substrate is cleaned.

When the operation patterns are formed by the user, it is determined whether the two cleaning brushes interfere with each other on the assumption that the two cleaning brushes operate in accordance with the produced operation patterns. In the case where it is determined that the two cleaning brushes interfere with each other, the user is required to reproduce operation patterns. It is necessary for the user to repeatedly produce operation patterns until it is determined that the two cleaning brushes do not interfere with each other. Such production of operation patterns are complicated.

In order to clean the substrate with the two cleaning brushes without using the operation patterns, a method, of allowing another brush to wait at a position outward of the substrate during a period in which one brush cleans the substrate, and allowing the one brush to wait at a position outward of the substrate during a period in which the other brush cleans the substrate, is considered. However, throughput of the substrate processing is reduced in this cleaning method.

An object of the present invention is to provide a substrate cleaning device which does not require a complicated setting operation regarding operations of a plurality of cleaners and is capable of improving cleanliness of a substrate while inhibiting a reduction in throughput, a substrate processing apparatus in which the complicated setting operation regarding the operations of the plurality of cleaners is not required, and the cleanliness of the substrate can be improved while a reduction in throughput is inhibited, and a substrate processing method in which the complicated setting operation regarding the operations of the plurality of cleaners is not required and by which the cleanliness of the substrate can be improved while a reduction in throughput is inhibited.

(1) A substrate cleaning device according to one aspect of the present invention includes a rotation holder that holds and rotates a substrate, first and second cleaners configured to be capable of being in contact with one surface of the substrate, a first mover that moves the first cleaner along a first path that extends to pass through a center of the substrate and an outer periphery of the substrate while allowing the first cleaner to be in contact with the one surface of the substrate rotated by the rotation holder, a second mover that moves the second cleaner along a second path that extends to pass through the center of the substrate and the outer periphery of the substrate while allowing the second cleaner to be in contact with the one surface of the substrate rotated by the rotation holder, a storage that stores position information in advance, the position information indicating a position of the first cleaner at a time point at which the first cleaner, which moves from the center of the substrate towards the outer periphery of the substrate, moves out of an interference region where a trajectory of the first cleaner extending along the first path and a trajectory of the second cleaner extending along the second path overlap with each other, and a controller that controls the first mover such that the first cleaner moves from the center of the substrate towards the outer periphery of the substrate, determines whether the first cleaner has moved out of the interference region based on the position information, and controls the second mover such that the second cleaner starts moving from the outer periphery of the substrate towards the center of the substrate at a time point at which it is determined that the first cleaner has moved out of the interference region.

In the substrate cleaning device, the first cleaner moves along the first path while the first cleaner is in contact with the one surface of the rotating substrate, and the second cleaner moves along the second path while the second cleaner is in contact with the one surface of the rotating substrate. Thus, the substrate is cleaned by the first and second cleaners.

The first cleaner moves from the center of the substrate towards the outer periphery of the substrate, and it is determined whether the first cleaner has moved out of the interference region. The second cleaner starts moving from the outer periphery of the substrate towards the center of the substrate at a time point at which it is determined that the first cleaner has moved out of the interference region. In this case, because the first cleaner is outside of the interference region, even when the first and second cleaners move simultaneously, the first cleaner and the second cleaner do not interfere with each other. Therefore, it is possible to prevent interference between the first cleaner and the second cleaner without a complicated setting operation regarding the movement of the first and second cleaners.

Further, in the above-mentioned configuration, because the second cleaner starts moving from the outer periphery of the substrate to the center of the substrate before the first cleaner reaches the outer periphery of the substrate, it is possible to reduce a time period from the time when the first cleaner starts moving towards the outer periphery until the time when the second cleaner reaches the center of the substrate. Therefore, the substrate can be quickly cleaned by the second cleaner after or during the cleaning of the substrate by the first cleaner.

As a result, a complicated setting operation for preventing interference regarding the movement of the first and second cleaners is unnecessary, and it is possible to improve the cleanliness of the substrate while a reduction in throughput is inhibited.

(2) A speed at which the second cleaner moves from the outer periphery of the substrate towards the center of the substrate may be higher than a speed at which the first cleaner moves from the center of the substrate towards the outer periphery of the substrate.

In this case, the second cleaner can move to the center of the substrate in a short period of time from a time point at which the first cleaner moves out of the interference region.

(3) The controller may control the first mover such that the first cleaner is spaced apart from the one surface of the substrate during a period in which the first cleaner moves from the outer periphery of the substrate to the center of the substrate, may control the first mover such that the first cleaner is in contact with the one surface of the substrate during a period in which the first cleaner moves from the center of the substrate towards the outer periphery of the substrate, may control the second mover such that the second cleaner is spaced apart from the one surface of the substrate during a period in which the second cleaner moves from the outer periphery of the substrate towards the center of the substrate, and may control the second mover such that the second cleaner is in contact with the one surface of the substrate during a period in which the second cleaner moves from the center of the substrate to the outer periphery of the substrate.

In this case, the one surface of the substrate is cleaned by the first cleaner during a period in which the first cleaner moves from the center of the substrate towards the outer periphery of the substrate. Contaminants that have been removed by the first cleaner during the cleaning of the one surface of the substrate by the first cleaner flow towards the outer periphery of the substrate by a centrifugal force. Thus, the removed contaminants are prevented from flowing towards the center of the substrate from the first cleaner.

The one surface of the substrate is cleaned by the second cleaner during a period in which the second cleaner moves from the center of the substrate towards the outer periphery of the substrate. Contaminants that have been removed by the second cleaner during the cleaning of the one surface of the substrate by the second cleaner flow towards the outer periphery of the substrate by a centrifugal force. Thus, the removed contaminants are prevented from flowing towards the center of the substrate from the second cleaner.

As a result, the cleanliness of the substrate that has been cleaned by the first and second cleaners is more sufficiently improved.

(4) A speed at which the first cleaner moves from the outer periphery of the substrate towards the center of the substrate may be higher than a speed at which the first cleaner moves from the center of the substrate towards the outer periphery of the substrate, and a speed at which the second cleaner moves from the outer periphery of the substrate towards the center of the substrate may be higher than a speed at which the second cleaner moves from the center of the substrate towards the outer periphery of the substrate.

In this case, the first and second cleaners located at the outer periphery of the substrate can move to the center of the substrate in a short period of time.

(5) The first cleaner may be a polisher, and the second cleaner may be a brush.

In this case, the one surface of the substrate is polished by the polisher, and then the one surface of the substrate is cleaned by the brush. Thus, contaminants generated due to the polishing of the one surface of the substrate are removed. Therefore, cleanliness of the substrate is more sufficiently improved.

(6) The controller may compare a first moving speed with a second moving speed in advance, the first moving speed being a speed at which the first cleaner moves from the center of the substrate towards the outer periphery of the substrate and the second moving speed being a speed at which the second cleaner moves from the outer periphery of the substrate towards the center of the substrate, and in the case where the first moving speed is equal to or higher than the second moving speed, does not have to determine whether the first cleaner has moved out of the interference region, and may control the first and second movers such that movement of the first cleaner from the center of the substrate towards the outer periphery of the substrate and movement of the second cleaner from the outer periphery of the substrate towards the center of the substrate simultaneously start.

In the case where the first moving speed is equal to or higher than the second moving speed, even when the movement of the first cleaner from the center of the substrate towards the outer periphery of the substrate and the movement of the second cleaner from the outer periphery of the substrate towards the center of the substrate start simultaneously, the first and second cleaners do not interfere with each other. Thus, the movement of the second cleaner from the outer periphery of the substrate towards the center of the substrate can start at an earlier time point. Therefore, the second cleaner can move to the center of the substrate in a short period of time from a time point at which the first cleaner start moving from the center of the substrate towards the outer periphery of the substrate.

(7) A substrate processing apparatus according to another aspect of the present invention arranged to be adjacent to an exposure device includes a coating device that applies a photosensitive film to an upper surface of a substrate, the above-mentioned substrate cleaning device, and a transport device that transports the substrate among the coating device, the substrate cleaning device and the exposure device, wherein the substrate cleaning device removes contaminants from a lower surface that is used as the one surface of the substrate before exposure processing for the substrate by the exposure device.

In the substrate processing apparatus, contaminants on the lower surface of the substrate on which the exposure processing has not been performed are removed by the above-mentioned substrate cleaning device. In the above-mentioned substrate cleaning device, a complicated setting operation regarding the movement of the first and second cleaners is not required, and the cleanliness of the substrate can be improved while a reduction in throughput is inhibited. As a result, an occurrence of processing defects in the substrate caused by the contamination of the lower surface of the substrate is inhibited without an increase in manufacturing cost of the substrate.

(8) A substrate cleaning method according to yet another aspect of the present invention includes the steps of holding and rotating a substrate, moving a first cleaner along a first path that extends to pass through a center of the substrate and an outer periphery of the substrate while allowing the first cleaner to be in contact with one surface of the rotating substrate, moving a second cleaner along a second path that extends to pass through the center of the substrate and the outer periphery of the substrate while allowing the second cleaner to be in contact with the one surface of the rotating substrate, and storing position information in advance, the position information indicating a position of the first cleaner at a time point at which the first cleaner, which moves from the center of the substrate towards the outer periphery of the substrate, moves out of an interference region where a trajectory of the first cleaner extending along the first path and a trajectory of the second cleaner extending along the second path overlap with each other, wherein the step of moving the first cleaner along the first path includes moving the first cleaner from the center of the substrate towards the outer periphery of the substrate, and determining whether the first cleaner has moved out of the interference region based on the position information, and the step of moving the second cleaner along the second path includes starting movement of the second cleaner from the outer periphery of the substrate towards the center of the substrate at a time point at which it is determined in the determining step that the first cleaner has moved out of the interference region.

In the substrate cleaning method, the first cleaner moves along the first path while the first cleaner is in contact with the one surface of the rotating substrate, and the second cleaner moves along the second path while the second cleaner is in contact with the one surface of the rotating substrate. Thus, the substrate is cleaned by the first and second cleaners.

The first cleaner moves from the center of the substrate towards the outer periphery of the substrate, and it is determined whether the first cleaner has moved out of the interference region. The movement of the second cleaner from the outer periphery of the substrate towards the center of the substrate starts at a time point at which it is determined that the first cleaner has moved out of the interference region. In this case, because the first cleaner is outside of the interference region, even when the first and second cleaners move simultaneously, the first and second cleaners do not interfere with each other. Therefore, it is possible to prevent interference between the first cleaner and the second cleaner without the complicated setting operation regarding the movement of the first and second cleaners.

Further, in the above-mentioned configuration, the second cleaner starts moving from the outer periphery of the substrate towards the center of the substrate before the first cleaner reaches the outer periphery of the substrate, so that a period from the time when the first cleaner starts moving towards the outer periphery until the time when the second cleaner reaches the center of the substrate can be shortened. Therefore, the substrate can be quickly cleaned by the second cleaner after or during the cleaning of the substrate by the first cleaner.

As a result, it is possible to improve the cleanliness of the substrate without a complicated setting operation for preventing the interference regarding the movement of the first and second cleaners while inhibiting a reduction in throughput.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate cleaning device, a substrate processing apparatus and a substrate cleaning method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, an upper surface of the substrate refers to a surface of the substrate directed upward, and a lower surface of the substrate refers to a surface directed downward.

In the present invention, contamination of the substrate refers to a state where the substrate is contaminated with contaminants, suction marks, contact marks or the like. Further, in the present invention, cleaning of the substrate includes removing contaminants by polishing one surface of the substrate with use of a polisher, and removing contaminants with use of a brush and with no polishing of the one surface of the substrate. In the following description, cleaning of the substrate with use of the polisher is referred to as polish cleaning, and cleaning of the substrate with use of the brush is referred to as brush cleaning.

[1] Substrate Cleaning Device

Figure 1:
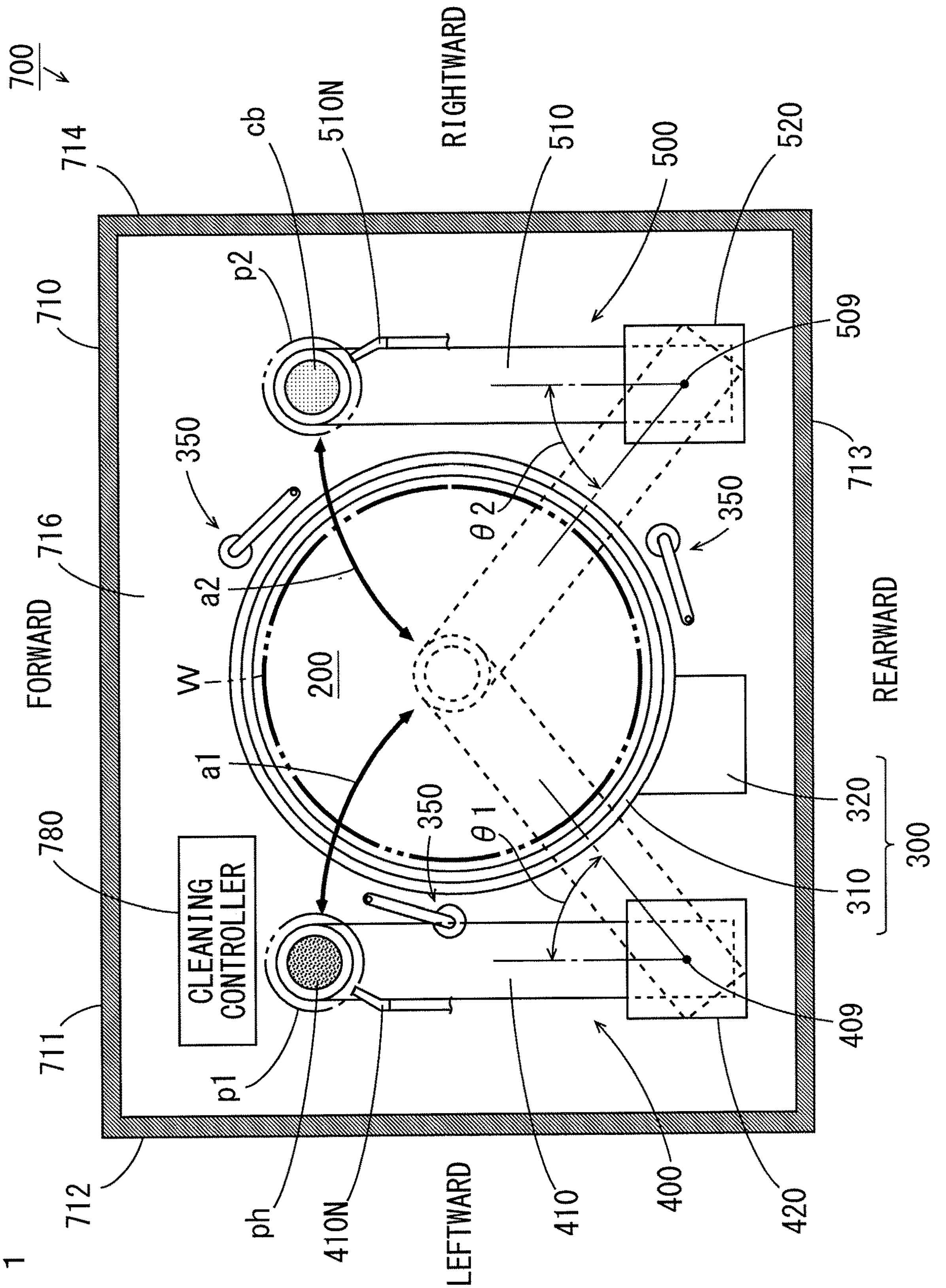
FIG. 1 is a schematic plan view showing a schematic configuration of a substrate cleaning device according to one embodiment of the present invention.

FIG. 1 is a schematic plan view showing a schematic configuration of the substrate cleaning device according to the one embodiment of the present invention.

As shown in FIG. 1, the substrate cleaning device 700 includes a spin chuck 200, a guard mechanism 300, a plurality (three in the present example) of receiving transferring mechanisms 350, a substrate polishing mechanism 400, a substrate cleaning mechanism 500, a casing 710 and a cleaning controller 780.

The casing 710 has four sidewalls 711, 712, 713, 714, a ceiling portion (not shown) and a bottom surface portion 716. The sidewalls 711, 713 are opposite to each other, and the sidewalls 712, 714 are opposite to each other. In the sidewall 711, an opening (not shown) for allowing the substrate W to be carried in and carried out between the inside and the outside of the casing 710 is formed.

In the following description, a direction directed from the inside of the casing 710 towards the outside of the casing 710 through the sidewall 711 is referred to as forward of the substrate cleaning device 700, and a direction directed from the inside of the casing 710 towards the outside of the casing 710 through the sidewall 713 is referred to as rearward of the substrate cleaning device 700. Further, a direction directed from the inside of the casing 710 towards the outside of the casing 710 through the sidewall 712 is referred to as leftward of the substrate cleaning device 700, and a direction directed from the inside of the casing 710 towards the outside of the casing 710 through the sidewall 714 is referred to as rightward of the substrate cleaning device 700.

The spin chuck 200 is provided at a position above a center portion inside of the casing 710. The spin chuck 200 holds and rotates the substrate W in a horizontal attitude. In FIG. 1, the substrate W held by the spin chuck 200 is indicated by a thick two-dots and dash line. The spin chuck 200 is connected to a fluid supply system (not shown) through a pipe. The fluid supply system supplies a cleaning liquid to a below-mentioned liquid supply pipe 215 (FIG. 3) of the spin chuck 200. In the present embodiment, pure water is used as the cleaning liquid.

The guard mechanism 300 and the three receiving transferring mechanisms 350 are provided below the spin chuck 200. The guard mechanism 300 includes a guard 310 and a guard lifting lowering driver 320.

The substrate polishing mechanism 400 is provided at a position further leftward than the guard mechanism 300 and the plurality of receiving transferring mechanisms 350. The substrate polishing mechanism 400 is used for the polish cleaning, and removes contaminants from the lower surface of the substrate W by polishing the lower surface of the substrate W rotated by the spin chuck 200. The substrate polishing mechanism 400 includes an arm 410 and an arm support post 420. The arm support post 420 extends in an up-and-down direction in the vicinity of the sidewall 713 located behind the arm support post 420. The arm 410 extends in a horizontal direction from the arm support post 420 with its one end supported inside of the arm support post 420 to be liftable, lowerable and rotatable.

A polishing head ph that polishes the lower surface of the substrate W held by the spin chuck 200 is attached to the other end of the arm 410. The polishing head ph is columnar and formed of a PVA (polyvinyl alcohol) sponge in which abrasive grains are dispersed, for example. A driving system for rotating the polishing head ph about its center axis is provided inside of the arm 410. Details of the driving system will be described below. An outer diameter of the polishing head ph is set smaller than a diameter of the substrate W. In the case where the diameter of the substrate W is 300 mm, the outer diameter of the polishing head ph is set to about 20 mm, for example.

A nozzle 410N is attached to a portion, in the vicinity of the polishing head ph, of the arm 410. The nozzle 410N is connected to the fluid supply system (not shown) through a pipe. The fluid supply system supplies the cleaning liquid to the nozzle 410N. A discharge port of the nozzle 410N is directed towards the vicinity of an upper end surface (a polishing surface) of the polishing head ph.

In a waiting state where the polish cleaning by the polishing head ph is not performed, the arm 410 is supported by the arm support post 420 to extend in a front-and-rear direction of the substrate cleaning device 700. At this time, the polishing head ph is located at a position further outward (leftward) and lower than the substrate W held by the spin chuck 200. In this manner, a position at which the polishing head ph is arranged with the arm 410 extending in the front-and-rear direction is referred to as a head waiting position p1. The head waiting position p1 is indicated by a two-dots and dash line in FIG. 1.

When the polish cleaning by the polishing head ph is performed, the arm 410 is rotated about a center axis 409 of the arm support post 420. Thus, as indicated by a thick arrow a1 in FIG. 1, at a height lower than the substrate W, the polishing head ph moves between a position opposite to a center of the substrate W held by the spin chuck 200 and the head waiting position p1. Further, the height of the arm 410 is adjusted such that the upper end surface (the polishing surface) of the polishing head ph comes into contact with the lower surface of the substrate W.

In the present embodiment, a direction in which the arm 410 extends when the polishing head ph is located at the head waiting position p1 is defined as a reference direction of the polishing head ph. When the substrate cleaning device 700 is viewed from above, an angle formed by the reference direction with a direction in which the arm 410 actually extends is defined as a rotation angle $\theta 1$ of the arm 410.

The substrate cleaning mechanism 500 is provided at a position further rightward than the guard mechanism 300 and the plurality of receiving transferring mechanisms 350. The substrate cleaning mechanism 500 is used for the brush cleaning and removes contaminants from the lower surface of the substrate W rotated by the spin chuck 200 without polishing the substrate W. The substrate cleaning mechanism 500 includes an arm 510 and an arm support post 520. The arm support post 520 extends in the up-and-down direction in the vicinity of the sidewall 713 located behind the arm support post 520. The arm 510 extends in the horizontal direction from the arm support post 520 with its one end supported inside of the arm support post 520 to be liftable, lowerable and rotatable.

A cleaning brush cb for cleaning the lower surface of the substrate W held by the spin chuck 200 is attached to the other end of the arm 510. The cleaning brush cb is columnar and formed of a PVA sponge, for example. A driving system for rotating the cleaning brush cb about its axial center is provided inside of the arm 510. Details of the driving system will be described below. An outer diameter of the cleaning brush cb is set smaller than a diameter of the substrate W. In the present example, the outer diameter of the cleaning brush cb is equal to the outer diameter of the polishing head ph. The outer diameter of the cleaning brush cb and the outer diameter of the polishing head ph may be set different from each other.

A nozzle 510N is attached to a portion, in the vicinity of the cleaning brush cb, of the arm 510. The nozzle 510N is connected to the fluid supply system (not shown) through a pipe. The fluid supply system supplies a cleaning liquid to the nozzle 510N. A discharge port of the nozzle 510N is directed towards the vicinity of an upper end surface (a cleaning surface) of the cleaning brush cb.

In a waiting state where the brush cleaning by the cleaning brush cb is not performed, the arm 510 is supported by the arm support post 520 to extend in the front-and-rear direction of the substrate cleaning device 700. At this time, the cleaning brush cb is located at a position further outward (rightward) and lower than the substrate W held by the spin chuck 200. In this manner, a position at which the cleaning brush cb is arranged with the arm 510 extending in the front-and-rear direction is referred to as a brush waiting position p2. The brush waiting position p2 is indicated by a two-dots and dash line in FIG. 1.

When the brush cleaning by the cleaning brush cb is performed, the arm 510 is rotated about a center axis 509 of the arm support post 520. Thus, as indicated by a thick arrow a2 in FIG. 1, at a height lower than the substrate W, the cleaning brush cb moves between a position opposite to the center of the substrate W held by the spin chuck 200 and the brush waiting position p2. Further, the height of the arm 510 is adjusted such that the upper end surface (the cleaning surface) of the cleaning brush cb comes into contact with the lower surface of the substrate W.

In the present embodiment, a direction in which the arm 510 extends when the cleaning brush cb is located at the brush waiting position p2 is defined as a reference direction of the cleaning brush cb. When the substrate cleaning device 700 is viewed from above, an angle formed by the reference direction with a direction in which the arm 510 actually extends is defined as a rotation angle θ2 of the arm 510.

The cleaning controller 780 includes a CPU (Central Processing Unit), a ROM (Read Only Memory), a RAM (Random Access Memory) and the like. A control program is stored in the ROM. The CPU controls an operation of each part of the substrate cleaning device 700 by executing the control program stored in the ROM using the RAM.

Figure 6:
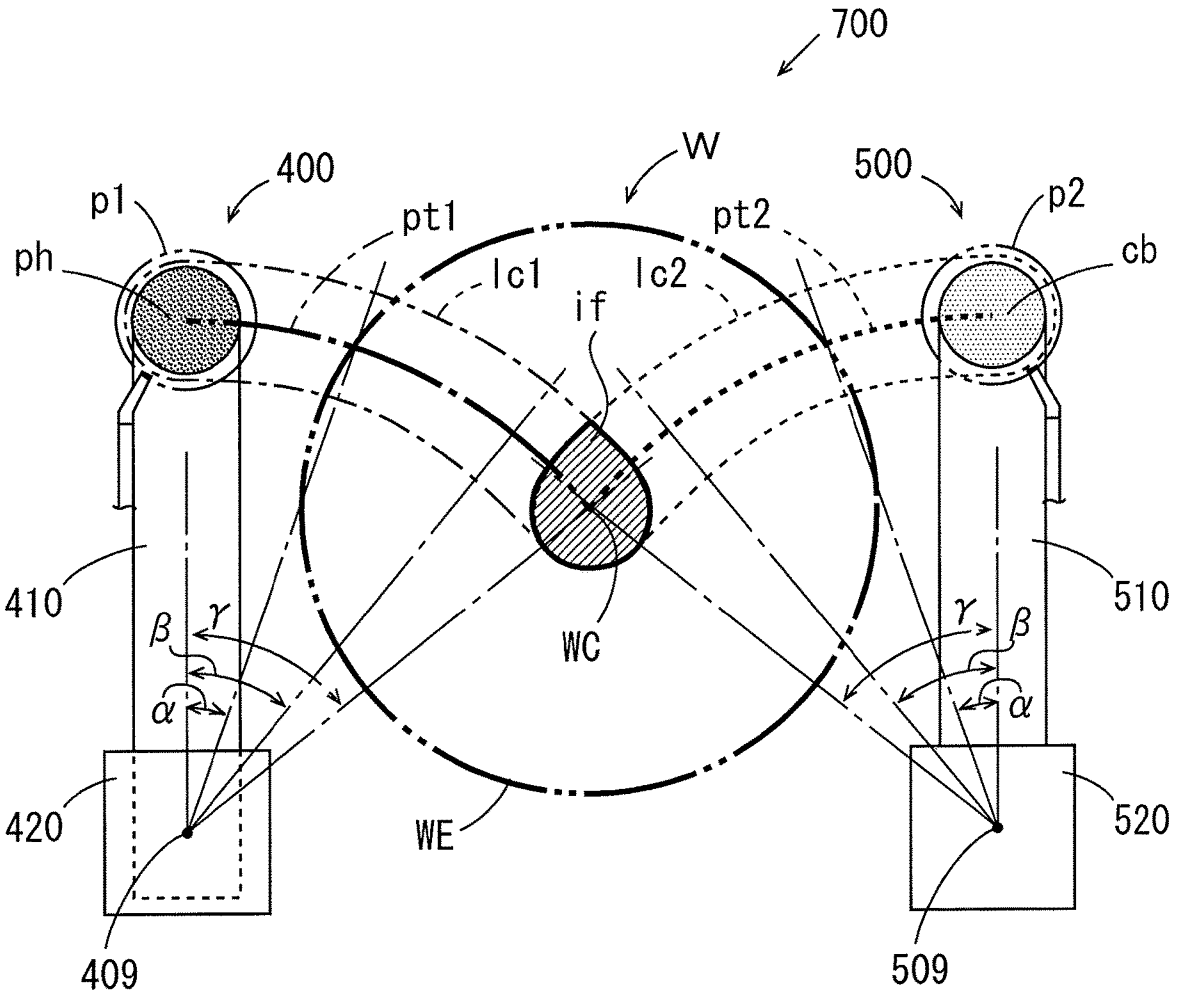
FIG. 6 is a plan view for explaining an interference region and position information.

Here, in the substrate cleaning device 700 of FIG. 1, a region in which the polishing head ph and the cleaning brush cb may interfere with each other is defined as an interference region 'if' (FIG. 6). Details of the interference region 'if' will be described below.

In the ROM and the RAM of the cleaning controller 780, position information defined with respect to the above-mentioned interference region 'if' and speed information indicating moving speeds of the polishing head ph and the cleaning brush cb. Details of the position information and the speed information will be described below. The position information and the speed information are set by a user of the substrate cleaning device 700. For example, the position information and the speed information are produced by an operation of an operation unit (not shown) by the user, and stored in a position information storage 785 (FIG. 5) and a speed information storage 786 (FIG. 5) of the cleaning controller 780, described below.

[2] Details of Substrate Polishing Mechanism and Substrate Cleaning Mechanism

The substrate polishing mechanism 400 and the substrate cleaning mechanism 500 of FIG. 1 basically have the same configuration except that the different members (the polishing head ph and the cleaning brush cb) are respectively provided at the other ends of the arms 410, 510. Thus, the configuration of the substrate polishing mechanism 400 is described as a representative of the substrate polishing mechanism 400 and the substrate cleaning mechanism 500.

Figure 2:
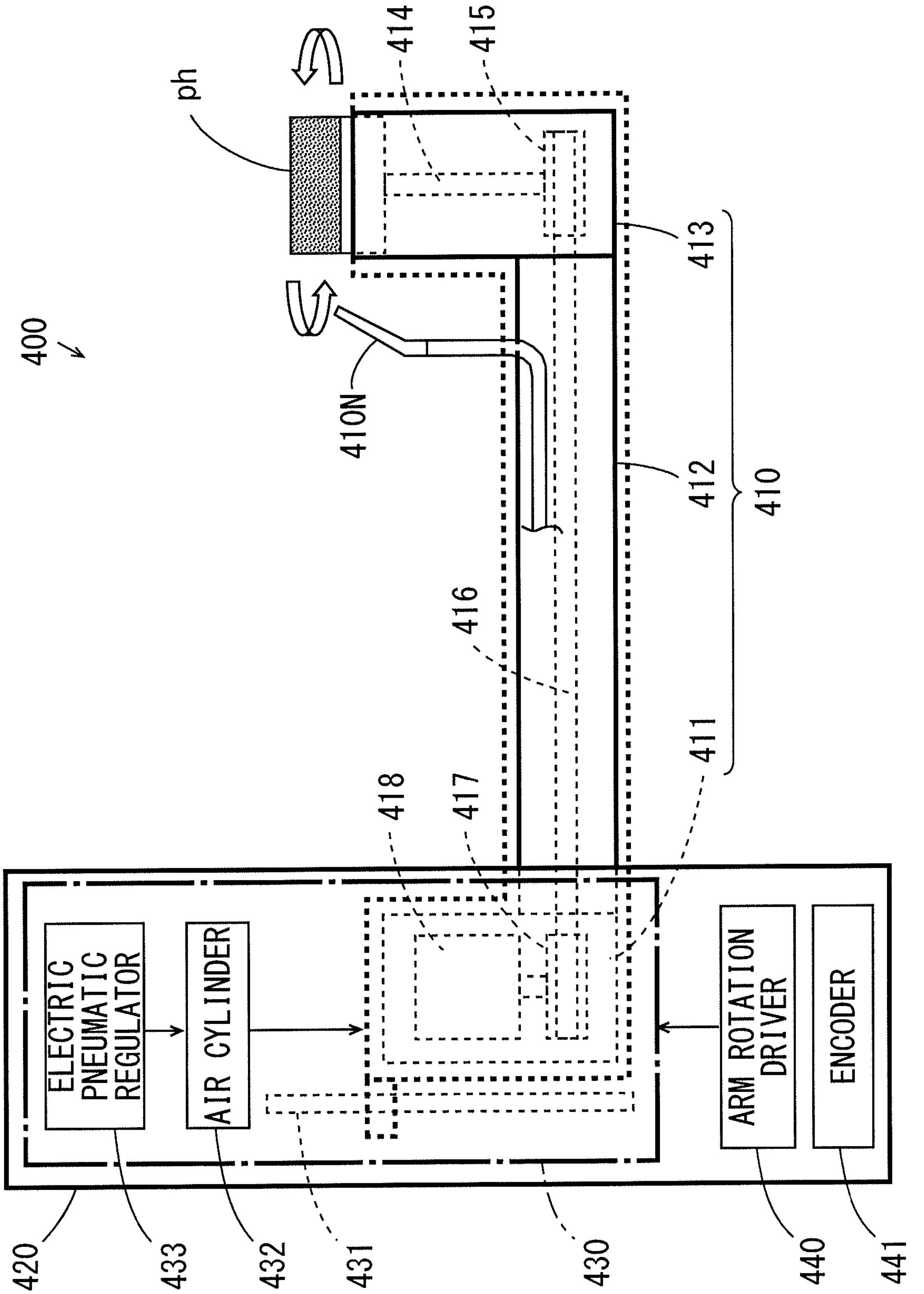
FIG. 2 is a schematic side view showing a configuration of a substrate polishing mechanism of FIG. 1.

FIG. 2 is a schematic side view showing the configuration of the substrate polishing mechanism 400 of FIG. 1. As shown in FIG. 2, the arm 410 includes a one arm end 411, an arm main body 412 and another arm end 413 that are integrally connected to one another. An arm lifting lowering driver 430, which supports the one arm end 411 of the arm 410 such that the one arm end 411 of the arm 410 is liftable and lowerable, is provided inside of the arm support post 420. Further, an arm rotation driver 440 that rotatably supports the arm 410 and the arm lifting lowering driver 430 about a center axis of the arm support post 420 is provided inside of the arm support post 420.

A pulley 417 and a motor 418 are provided inside of the one arm end 411. The pulley 417 is connected to a rotation shaft of the motor 418. Further, a rotation support shaft 414 and a pulley 415 are provided inside of the other arm end 413. The polishing head ph is attached to an upper end of the rotation support shaft 414. The pulley 415 is attached to a lower end of the rotation support shaft 414. Further, a belt 416 that connects the two pulleys 415, 417 to each other is provided inside of the arm main body 412. The motor 418 is operated based on the control of the cleaning controller 780 of FIG. 1. In this case, a rotational force of the motor 418 is transmitted to the polishing head ph via the pulley 417, the belt 416, the pulley 415 and the rotation support shaft 414. Thus, the polishing head ph is rotated about an axis extending in the up-and-down direction.

The arm lifting lowering driver 430 includes a linear guide 431 extending in a vertical direction, an air cylinder 432 and an electric pneumatic regulator 433. The one arm end 411 is attached to the linear guide 431 to be liftable and lowerable. In this state, the one arm end 411 is connected to the air cylinder 432.

The air cylinder 432 is provided to be extendible and contractible in the vertical direction by the supply of air through the electric pneumatic regulator 433. The electric pneumatic regulator 433 is an electrical control type regulator controlled by the cleaning controller 780 of FIG. 1. The length of the air cylinder 432 changes according to a pressure of the air supplied to the air cylinder 432 from the electric pneumatic regulator 433. Thus, the one arm end 411 moves to a height corresponding to the length of the air cylinder 432.

The arm rotation driver 440 includes a motor and a plurality of gears, for example, and is controlled by the cleaning controller 780 of FIG. 1. The arm support post 420 is further provided with an encoder 441 for detecting a rotation angle θ1 (FIG. 1) of the arm 410. The encoder 441 detects the rotation angle θ1 of the arm 410 with respect to a direction in which the arm 410 extends when the polishing head ph is located at the head waiting position p1 and supplies a signal indicating a result of detection to the cleaning controller 780 of FIG. 1. Thus, the rotation angle θ1 of the arm 410 is controlled by feedback control.

The substrate cleaning mechanism 500 includes an encoder corresponding to the above-mentioned encoder 441. In this case, the encoder of the substrate cleaning mechanism 500 detects a rotation angle θ2 (FIG. 1) of the arm 510 with respect to a direction in which the arm 510 extends when the cleaning brush cb is located at the brush waiting position p2 (FIG. 1) and supplies a signal indicating a result of detection to the cleaning controller 780 of FIG. 1. Thus, the rotation angle θ2 of the arm 510 is controlled by the feedback control.

Figure 3:
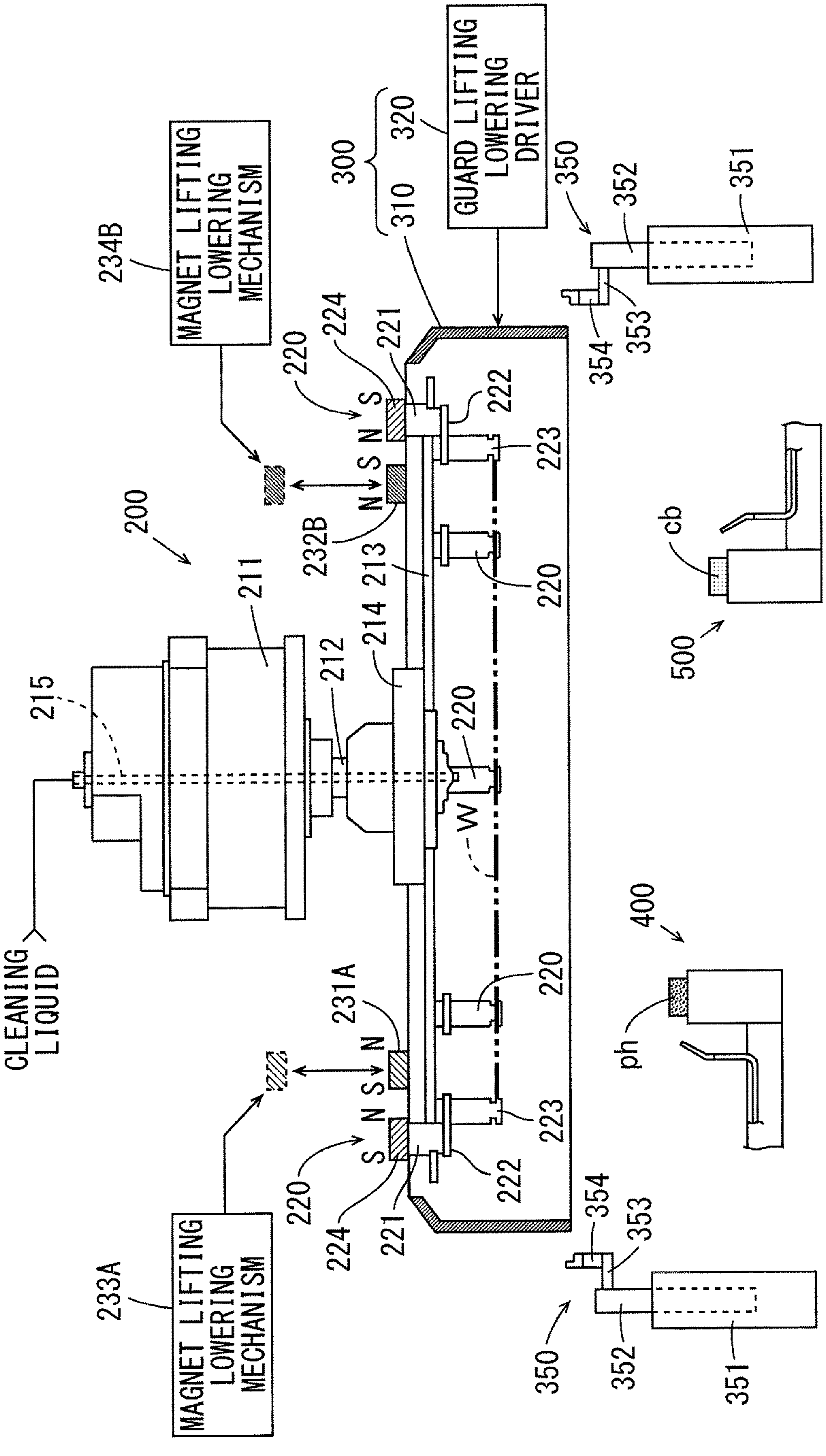
FIG. 3 is a schematic side view for explaining configurations of a spin chuck and its peripheral members of FIG. 1.
Figure 4:
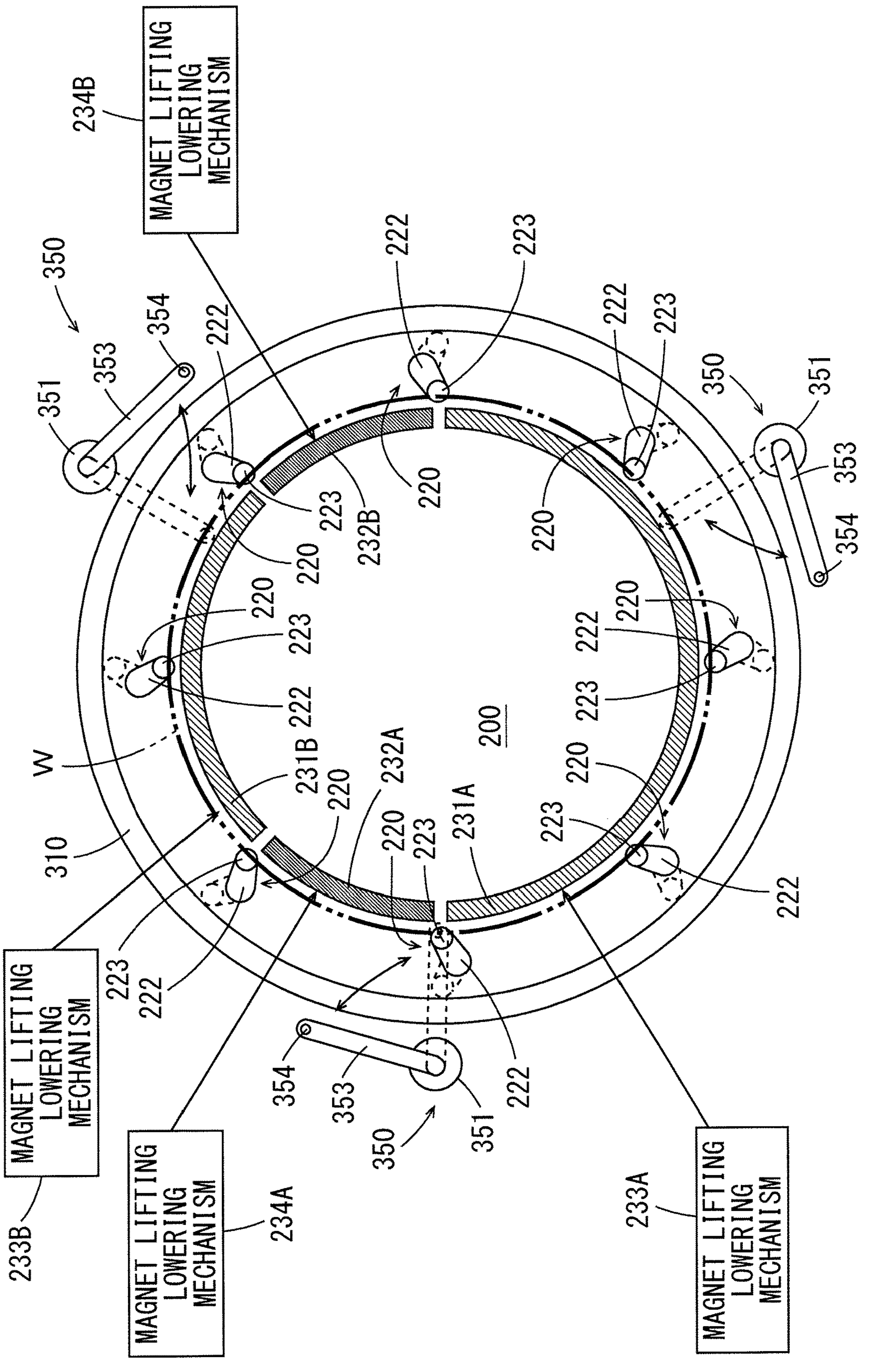
FIG. 4 is a schematic plan view for explaining the configurations of the spin chuck and its peripheral members of FIG. 1.

[3] Details of Spin Chuck, Guard Mechanism and Plurality of Substrate Receiving Transferring Mechanisms FIG. 3 is a schematic side view for explaining a configuration of the spin chuck 200 and its peripheral members of FIG. 1, and FIG. 4 is a schematic plan view for explaining the configuration of the spin chuck 200 and its peripheral members of FIG. 1. In each of FIGS. 3 and 4, the substrate W held by the spin chuck 200 is indicated by a thick two-dots and dash line.

As shown in FIGS. 3 and 4, the spin chuck 200 includes a spin motor 211, a disc-shape spin plate 213, a plate support member 214, four magnet plates 231A, 231B, 232A, 232B, four magnet lifting lowering mechanisms 233A, 233B, 234A, 234B and a plurality of chuck pins 220.

The spin motor 211 is supported by a support member (not shown) at a position slightly above the center inside of the casing 710 of FIG. 1. The spin motor 211 has a rotation shaft 212 that extends downward. The plate support member 214 is attached to the lower end of the rotation shaft 212. The spin plate 213 is horizontally supported by the plate support member 214. The rotation shaft 212 is rotated by an operation of the spin motor 211, and the spin plate 213 is rotated about a vertical axis.

The liquid supply pipe 215 is inserted into the rotation shaft 212 and the plate support member 214. One end of the liquid supply pipe 215 projects downward from the lower end of the plate support member 214. The other end of the liquid supply pipe 215 is connected to the fluid supply system (not shown). The cleaning liquid can be discharged onto the upper surface of the substrate W held by the spin chuck 200 from the fluid supply system through the liquid supply pipe 215.

The plurality of chuck pins 220 are provided at the peripheral portion of the spin plate 213 at equal angular intervals with respect to the rotation shaft 212. In the present example, the eight chuck pins 220 are provided at the peripheral portion of the spin plate 213 at angular intervals of 45 degrees with respect to the rotation shaft 212. Each chuck pin 220 includes a shaft portion 221, a pin supporter 222, a holder 223 and a magnet 224.

The shaft portion 221 is provided to penetrate the spin plate 213 in the perpendicular direction. The pin supporter 222 is provided to extend in the horizontal direction from a lower end of the shaft portion 221. The holder 223 is provided to project downward from a tip end of the pin supporter 222. Further, the magnet 224 is attached to an upper end of the shaft portion 221 on the upper surface side of the spin plate 213.

Each chuck pin 220 is rotatable about a vertical axis and the shaft portion 221, and can be switched between a closed state where the holder 223 is in contact with the outer peripheral end of the substrate W and an opened state where the holder 223 is spaced apart from the outer peripheral end of the substrate W. In the present example, each chuck pin 220 is in the closed state in the case where an N pole of the magnet 224 is on the inner side, and each chuck pin 220 is in the opened state in the case where an S pole of the magnet 224 is on the inner side.

In a position above the spin plate 213, as shown in FIG. 4, the four arc-like magnet plates 231A, 231B, 232A, 232B are arranged in a circumferential direction extending about the rotation shaft 212. The magnet plate 232A of the four magnet plates 231A, 231B, 232A, 232B is located above a first path pt1 (FIG. 6, described below) on which the polishing head ph moves. Further, the magnet plate 232B is located above a second path pt2 (FIG. 6, described below) on which the cleaning brush cb moves.

Each of the magnet plates 231A, 231B, 232A, 232B has an S pole on the outside and has an N pole on the inside. The magnet lifting lowering mechanisms 233A, 233B, 234A, 234B respectively lift and lower the magnet plates 231A, 231B, 232A, 232B. Thus, each of the magnet plates 231A, 231B, 232A, 232B can independently move between an upper position higher than the magnet 224 of the chuck pin 220 and a lower position at a height substantially equal to the height of the magnet 224 of the chuck pin 220.

Each chuck pin 220 is switched between the opened state and the closed state by the lifting and lowering of the magnet plates 231A, 231B, 232A, 232B. Specifically, each chuck pin 220 enters the opened state in the case where a magnet plate, closest to the chuck pin 220, of the plurality of magnet plates 231A, 231B, 232A, 232B is located at the upper position. On the other hand, each chuck pin 220 enters the closed state in the case where a magnet plate, closest to the chuck pin 220, of the plurality of magnet plates 231A, 231B, 232A, 232B is located at the lower position.

The plurality of receiving transferring mechanisms 350 are arranged around the rotation shaft 212 of the spin chuck 200 at equal angular intervals and arranged outward of the guard 310. Each receiving transferring mechanism 350 includes a lifting lowering rotation driver 351, a rotation shaft 352, an arm 353 and a holding pin 354.

The rotation shaft 352 is provided to extend upward from the lifting lowering rotation driver 351. The arm 353 is provided to extend in the horizontal direction from the upper end of the rotation shaft 352. The holding pin 354 is provided at a tip end of the arm 353, thereby being capable of holding the outer peripheral end WE of the substrate W.

The rotation shaft 352 performs a rotating operation by the lifting lowering rotation driver 351. Thus, the substrate W is received and transferred between the transport device of the substrate W provided outside of the substrate cleaning device 700 and the plurality of holding pins 354. Further, the rotation shaft 352 performs a lifting lowering operation and the rotating operation by the lifting lowering rotation driver 351. Thus, the substrate W is received and transferred between the plurality of holding pins 354 and the spin chuck 200.

As described above, the guard mechanism 300 includes the guard 310 and the guard lifting lowering driver 320. In FIG. 3, the guard 310 is shown in the longitudinal cross sectional view. The guard 310 is rotationally symmetric with respect to the rotation shaft 212 of the spin chuck 200, and provided at a position further outward than the spin chuck 200 and a space below the spin chuck 200.

The guard lifting lowering driver 320 is configured to be capable of lifting and lowering the guard 310, and holds the guard 310 at a height lower than the spin chuck 200 when the substrate W is not being cleaned or dried. On the other hand, the guard lifting lowering driver 320 holds the guard 310 at the same height as the substrate W held by the spin chuck 200 when the substrate W is being cleaned and dried. Thus, the guard 310 receives the cleaning liquid splashed from the substrate W when the substrate W is being cleaned and dried.

[4] Control System of Substrate Cleaning Device

Figure 5:
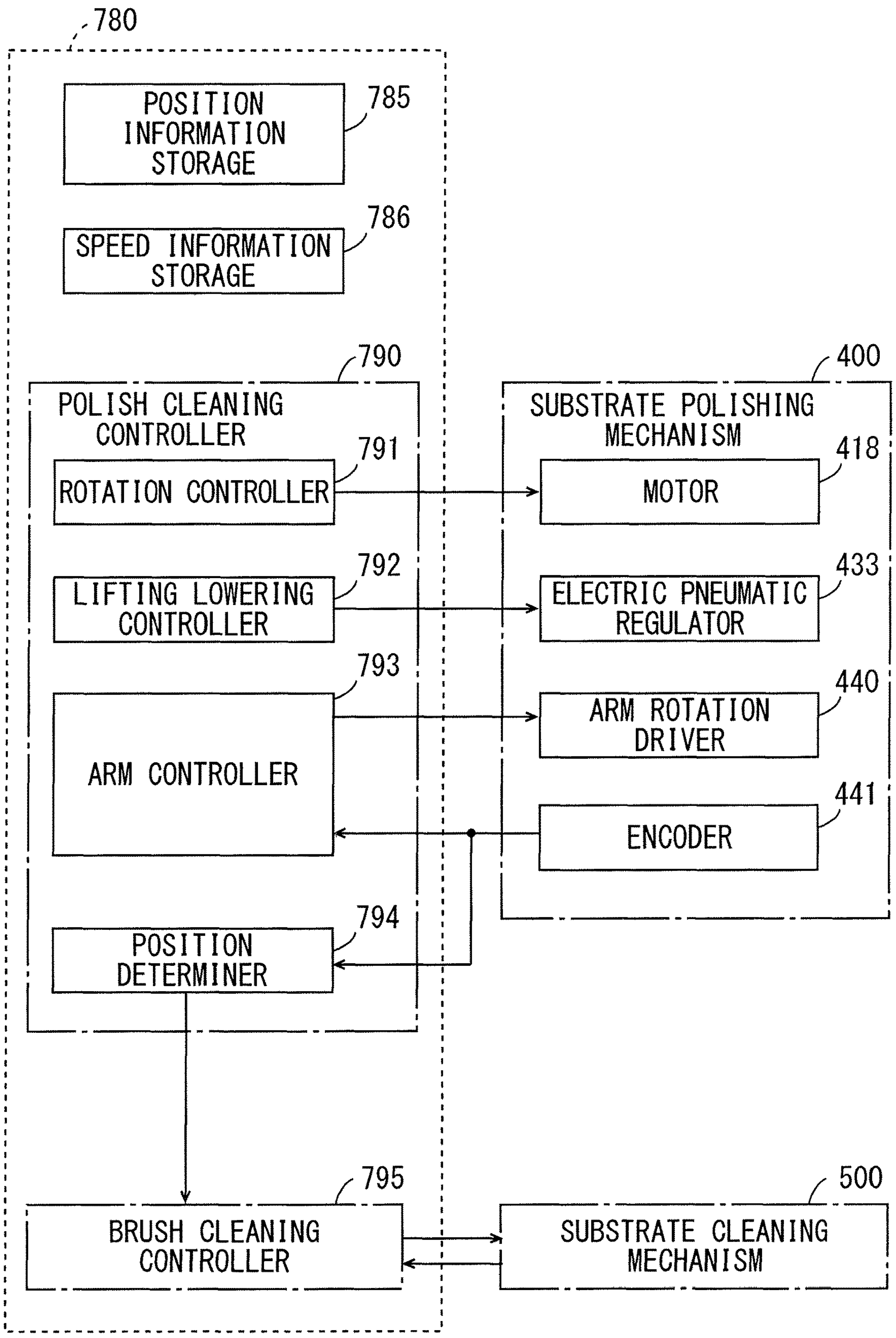
FIG. 5 is a block diagram showing part of the configuration of a control system of the substrate cleaning device of FIG. 1.

FIG. 5 is a block diagram showing part of the configuration of the control system of the substrate cleaning device 700 of FIG. 1. In FIG. 5, part of the functional configuration of the cleaning controller 780 is shown. The cleaning controller 780 includes a position information storage 785, a speed information storage 786, a polish cleaning controller 790 and a brush cleaning controller 795. The function of each part of the cleaning controller 780 of FIG. 5 is realized by the execution of the control program by the CPU.

The position information storage 785 is mainly constituted by part of the ROM or the RAM of the cleaning controller 780 and stores the above-mentioned position information. The speed information storage 786 is mainly constituted by part of the ROM or the RAM of the cleaning controller 780, and stores the moving speed of the polishing head ph and the moving speed of the cleaning brush cb when the substrate W is cleaned in the substrate cleaning device 700 as the speed information.

In the following description, a moving speed at which the polishing head ph moves from the center to the outer peripheral end of the substrate W is referred to as a first moving speed. Further, a moving speed at which the cleaning brush cb moves from the outer peripheral end of the substrate W to the center of the substrate W is referred to as a second moving speed.

The polish cleaning controller 790 includes a rotation controller 791, a lifting lowering controller 792, an arm controller 793 and a position determiner 794. The rotation controller 791 adjusts the rotation speed of the polishing head ph (FIG. 1) by controlling the motor 418 of the substrate polishing mechanism 400. The lifting lowering controller 792 adjusts the height of the polishing head ph (FIG. 1) by controlling the electric pneumatic regulator 433 of the substrate polishing mechanism 400. The arm controller 793 controls the arm rotation driver 440 based on the speed information stored in the speed information storage 786 of FIG. 5 and a signal from the encoder 441 of the substrate polishing mechanism 400. Thus, the polishing head ph moves on the below-mentioned first path pt1 (FIG. 6) at the first moving speed.

The position determiner 794 determines whether the polishing head ph, which moves from the center of the substrate W to the outer peripheral end of the substrate W, has moved out of the below-mentioned interference region 'if' (FIG. 6) based on the position information stored in the position information storage 785 and a signal from the encoder 441 of the substrate polishing mechanism 400. Further, the position determiner 794 supplies a result of determination to the brush cleaning controller 795.

The brush cleaning controller 795 basically has the same configuration as the polish cleaning controller 790 except for not including the position determiner 794. Similarly to a relationship between the polish cleaning controller 790 and the substrate polishing mechanism 400, the brush cleaning controller 795 controls an operation of each part of the substrate cleaning mechanism 500. Thus, the cleaning brush cb moves on the below-mentioned second path pt2 (FIG. 6) at the second moving speed.

Further, the brush cleaning controller 795 allows the movement of the cleaning brush cb from the outer peripheral end of the substrate W to the center of the substrate W to start when the polishing head ph moves out of the interference region 'if' (FIG. 6) based on a result of determination supplied from the position determiner 794 of the polish cleaning controller 790. Details of this control will be described below.

[5] Polish Cleaning and Brush Cleaning of Lower Surface of Substrate by Substrate Cleaning Device In the substrate cleaning device 700 of FIG. 1, the substrate W is carried into the casing 710, and then the upper surface of the substrate W held by the spin chuck 200 is cleaned. When the upper surface of the substrate W is cleaned, with the substrate W rotated while the outer peripheral end of the substrate W is held by all of the chuck pins 220 of the spin chuck 200, the cleaning liquid is supplied to the upper surface of the substrate W through the liquid supply pipe 215 of FIG. 3. The cleaning liquid spreads to the entire upper surface of the substrate W by a centrifugal force and is splashed outward. Thus, particles and the like adhering to the upper surface of the substrate W are cleaned away. Thereafter, the polish cleaning of the lower surface of the substrate W and the brush cleaning of the lower surface of the substrate W are performed with use of the above-mentioned position information and speed information.

Here, the position information will be described. FIG. 6 is a plan view for explaining the interference region and the position information. In FIG. 6, the substrate polishing mechanism 400 and the substrate cleaning mechanism 500 are shown, and the substrate W held by the spin chuck 200 of FIG. 1 is virtually indicated by a thick two-dots and line.

As indicated by a thick one-dot and dash line in FIG. 6, the first path pt1 on which a center of the polishing head ph of the substrate polishing mechanism 400 moves with respect to the rotating substrate W is defined. The first path pt1 is defined according to a dimension of the arm 410, for example. The first path pt1 extends in a circular arc shape to pass through a center of the head waiting position p1, and the center WC and the outer peripheral end WE of the substrate W rotated by the spin chuck 200. As indicated by the one-dot and dash line in FIG. 6, the center of the polishing head ph moves along the first path pt1, whereby a first trajectory Ic1 of the polishing head ph is formed.

Further, as indicated by a thick dotted line in FIG. 6, the second path pt2 on which a center of the cleaning brush cb of the substrate cleaning mechanism 500 moves with respect to the rotating substrate W is defined. The second path pt2 is defined according to a dimension of the arm 510, for example. The second path pt2 extends in a circular arc shape to pass through a center of the brush waiting position p2, and the center WC and the outer peripheral end WE of the substrate W rotated by the spin chuck 200. As indicated by the dotted line in FIG. 6, the center of the cleaning brush cb moves along the second path pt2, whereby a second trajectory Ic2 of the cleaning brush cb is formed.

When any one of the polishing head ph and the cleaning brush cb is present in an overlapping region of the first trajectory Ic1 and the second trajectory Ic2, the polishing head ph and the cleaning brush cb may interfere with each other depending on operations of the substrate polishing mechanism 400 and the substrate cleaning mechanism 500.

Then, as indicated by a thick solid line and hatching, the overlapping region of the first trajectory Ic1 and the second trajectory Ic2 is defined as the interference region 'if'.

As described above, the position information is defined with respect to the interference region 'if'. The position information is the information indicating a position of the polishing head ph at a time point at which the polishing head ph moves out of the interference region 'if' by the movement of the polishing head ph from the center WC of the substrate W towards the outer peripheral end WE of the substrate W. In the present embodiment, the rotation angle θ1 of the arm 410 at a time point at which the polishing head ph moves out of the interference region 'if' is set as the position information.

In the following description, the rotation angle θ1 of the arm 410 when the polishing head ph is located on the outer peripheral end WE of the substrate W is "α", and the rotation angle θ1 of the arm 410 when the polishing head ph is located on the center WC of the substrate W is "γ". Further, the rotation angle θ1 of the arm 410 at a time point at which the polishing head ph moves out of the interference region 'if' by the movement of the polishing head ph from the center WC towards the outer peripheral end WE of the substrate W is "β". In this case, "β" is stored in the position information storage 785 of the cleaning controller 780 as the position information.

The position information may be the information with which the position of the polishing head ph can be specified. Therefore, a parameter other than the rotation angle θ1 of the arm 410 may be used as the position information. For example, in the case where the arm rotation driver 440 of FIG. 5 is constituted by a pulse motor, the number of pulses supplied to the arm rotation driver 440 may be used as the position information instead of the rotation angle θ1 of the arm 410.

The substrate polishing mechanism 400 and the substrate cleaning mechanism 500 are arranged to be symmetric with each other with respect to a vertical plane extending in the front-and-rear direction through a rotation center of the substrate W held by the spin chuck 200. Therefore, in the present example, the rotation angle θ2 of the arm 510 when the cleaning brush cb is located on the outer peripheral end WE of the substrate W is "α", and the rotation angle θ2 of the arm 510 when the cleaning brush cb is located on the center WC of the substrate W is "γ". Further, the rotation angle θ2 of the arm 510 at a time point at which the cleaning brush cb moves out of the interference region 'if' by the movement of the cleaning brush cb from the center WC towards the outer peripheral end WE of the substrate W is "β".

Figure 7:
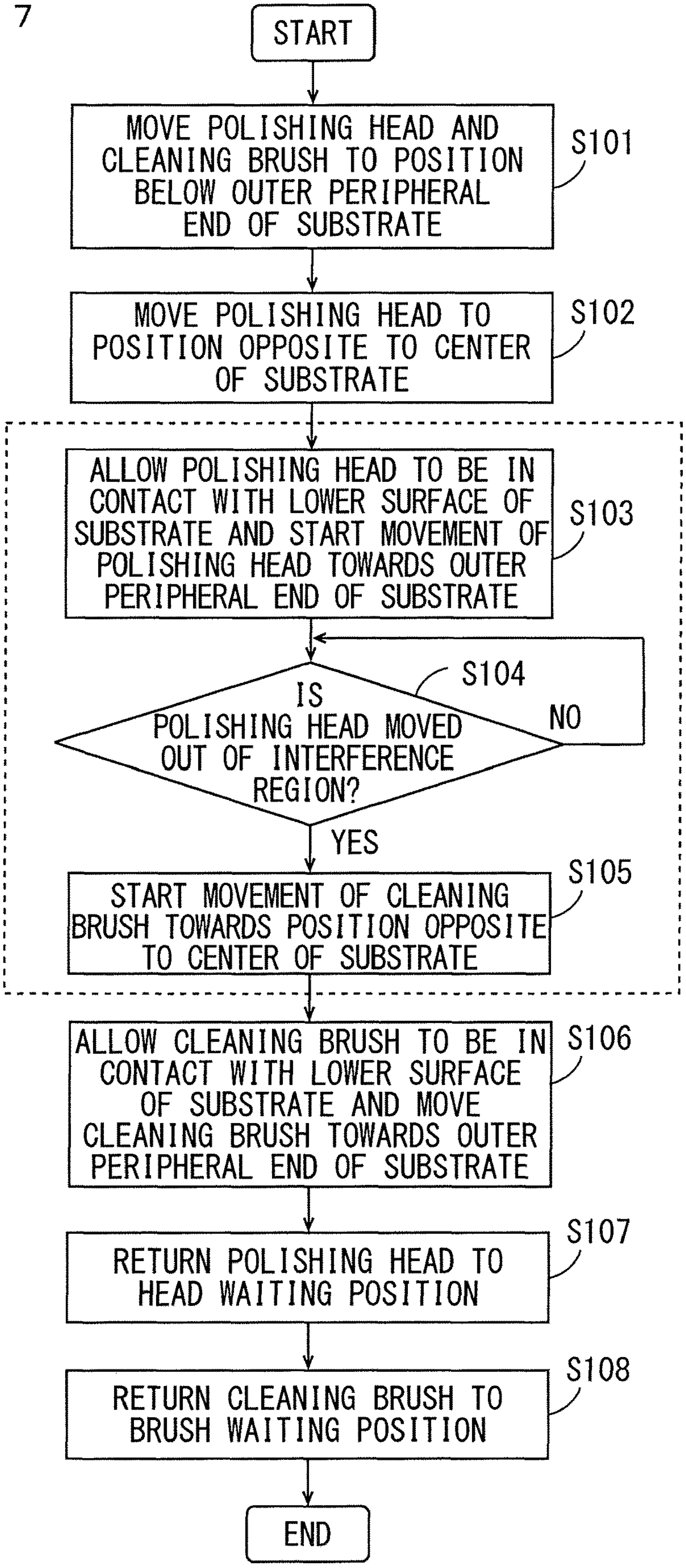
FIG. 7 is a flow chart showing a control operation of a cleaning controller when polish cleaning and brush cleaning are performed.

Details of the polish cleaning of the lower surface of the substrate W and the brush cleaning of the lower surface of the substrate W with use of the position information will be described with an operation of the cleaning controller 780. FIG. 7 is a flow chart showing the control operation of the cleaning controller 780 when the polish cleaning and the brush cleaning are performed, and FIGS. 8A to 8I are diagrams showing the states of the substrate polishing mechanism 400 and the substrate cleaning mechanism 500 that change according to a series of processing of FIG. 7.

Figures 8A, 8B, 8C, 8D, 8E, 8F, 8G, 8H, 8I:
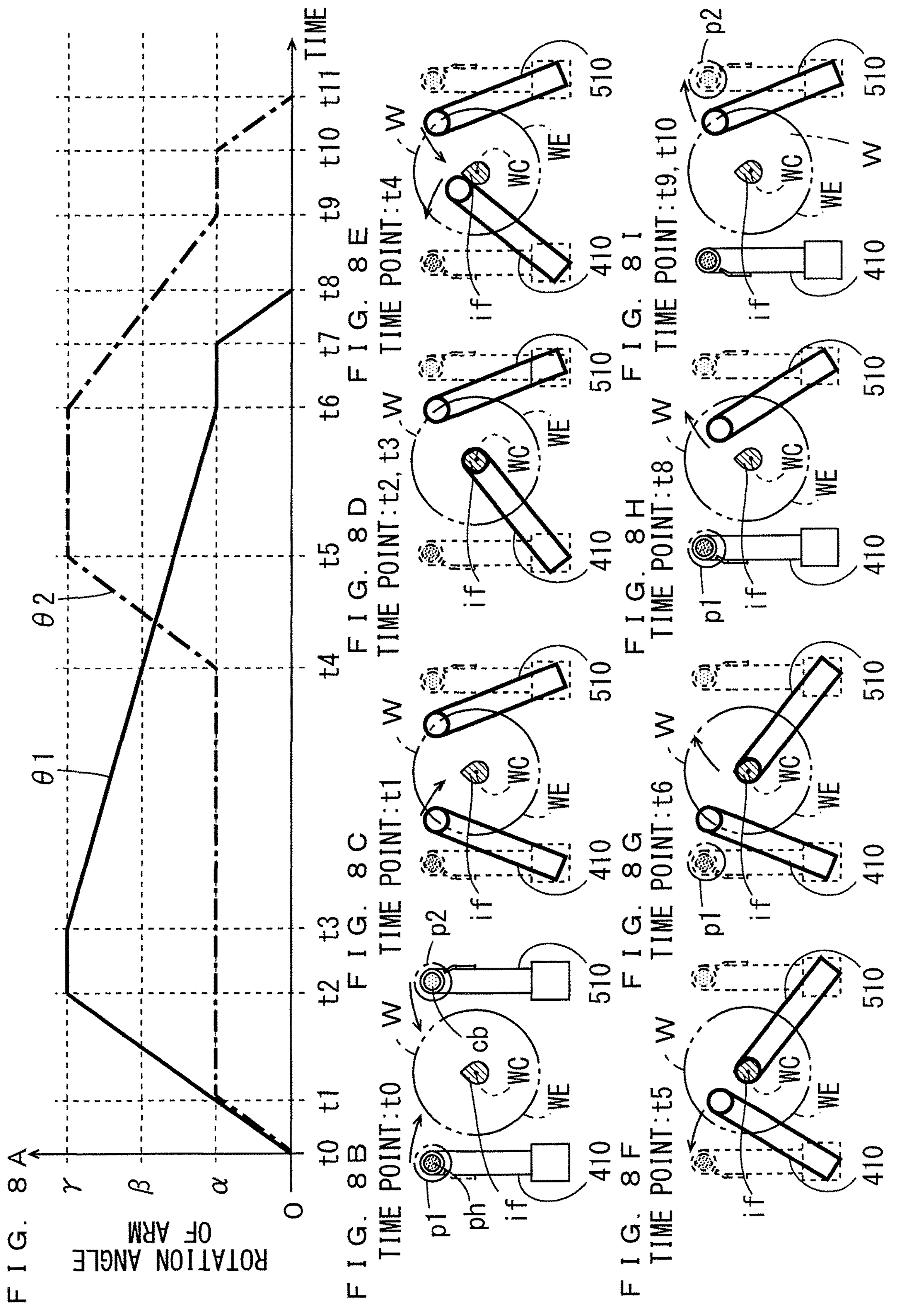
FIGS. 8A to 8I are diagrams showing states of the substrate polishing mechanism and a substrate cleaning mechanism that change according to a series of processing of FIG. 7.

In FIG. 8A, the changes of the rotation angles θ1, 02 of the arms 410, 510 are shown in a time chart. In the time chart of FIG. 8A, a thick solid line indicates the change of the rotation angle θ1 of the arm 410, and a thick one-dot and dash line indicates the change of the rotation angle θ2 of the arm 510. In FIG. 8B to 8I, states of the arms 410, 510 of the substrate polishing mechanism 400 and the substrate cleaning mechanism 500 at a plurality of time points in the time chart of FIG. 8A are shown in schematic plan views. Further, in each of the plan views of FIGS. 8B to 8I, the substrate W is virtually indicated by a two-dots and dash line.

At a time point t0 of FIG. 8A at which the polish cleaning and the brush cleaning start, the substrate W held by the spin chuck 200 is rotated at a predetermined speed. Further, the cleaning liquid is not supplied to each of the nozzle 410N of the substrate polishing mechanism 400 and the nozzle 510N of the substrate cleaning mechanism 500.

Further, as shown in FIG. 8B, the polishing head ph of the substrate polishing mechanism 400 and the cleaning brush cb of the substrate cleaning mechanism 500 are respectively located at the head waiting position p1 and the brush waiting position p2 at a height lower than the substrate W. At this time, the rotation angle θ1 of the arm 410 is "0", and the rotation angle θ2 of the arm 510 is also "0".

First, the cleaning controller 780 moves the polishing head ph and the cleaning brush cb to positions below the outer peripheral end WE of the substrate W (step S101). Thus, as indicated in FIGS. 8A and 8C, the polishing head ph and the cleaning brush cb respectively reach the positions below the outer peripheral end WE of the substrate W at a time point t1. At this time, the rotation angle θ1 of the arm 410 is "α", and the rotation angle θ2 of the arm 510 is also "α".

Next, the cleaning controller 780 further moves the polishing head ph to the position opposite to the center WC of the substrate W (step S102). In this case, the cleaning brush cb is in a waiting state at a position below the outer peripheral end WE of the substrate W. Thus, as shown in FIGS. 8A, 8C and 8D, the polishing head ph moves to the position opposite to the center WC of the substrate W without interfering with the cleaning brush cb during a period from the time point t1 to a time point t2. At the time point t2, the rotation angle θ1 of the arm 410 is "γ".

Then, the cleaning controller 780 allows the polishing head ph to be in contact with the lower surface of the substrate W and allows the movement of the polishing head ph towards the outer peripheral end WE of the substrate W to start (step S103). Specifically, the polishing head ph is lifted until coming into contact with the lower surface of the substrate W during a period from the time point t2 to a time point t3 of FIGS. 8A to 8I. The polishing head ph comes into contact with the lower surface of the substrate W at the time point t3, whereby the center WC of the lower surface of the substrate W is polished by the polishing head ph. At this time, the polishing head ph is located on the interference region 'if'. Thereafter, as shown in FIGS. 8E, 8F and 8G, the polishing head ph moves onto the outer peripheral end WE of the substrate W. The moving speed at this time is adjusted to the first moving speed that has been defined in advance as the speed information. Thus, the lower surface of the substrate W is polished from the center WC towards the outer peripheral end WE during a period from the time point t3 to a time point t6. At the time point t6, the rotation angle θ1 of the arm 410 is "α". The cleaning liquid is supplied from the nozzle 410N to the substrate W during a period from the time point t3 to the time point t6. Thus, contaminants stripped off from the lower surface of the substrate W by polishing are cleaned away by the cleaning liquid.

When the polishing head ph reaches the outer peripheral end WE of the substrate W at the time point t6, the polishing head ph may interfere with the plurality of chuck pins 220. Then, in the present example, when the polishing head ph reaches the outer peripheral end WE of the substrate W, the magnet plate 232A of FIG. 4 temporarily moves from the lower position to the upper position by the magnet lifting lowering mechanism 234A of FIG. 4. Thus, each chuck pin 220 of the spin chuck 200 locally enters the opened state in a region corresponding to the magnet plate 232A. Because the magnet plate 232A is located above the first path pt1 (FIG. 6) of the polishing head ph, the polishing head ph is prevented from interfering with the plurality of chuck pins 220.

During the movement of the polishing head ph in the step S103, the cleaning controller 780 determines whether the polishing head ph has moved out of the interference region ‘if’ based on a signal supplied from the encoder 441 of FIG. 5 and the above-mentioned position information (step S104). This determination processing is repeated in a constant period. The cleaning controller 780 determines that the polishing head ph is within the interference region ‘if’ when the rotation angle θ1 of the arm 410 detected by the encoder 441 is larger than “β” of FIG. 6. Further, the cleaning controller 780 determines that the polishing head ph is outside of the interference region ‘if’ when the rotation angle θ1 of the arm 410 detected by the encoder 441 is equal to or smaller than “β” of FIG. 6.

In the present example, as shown in FIGS. 8A and 8E, the polishing head ph moves out of the interference region ‘if’ at the time point t4. At this time, the rotation angle θ1 of the arm 410 is “β”. When the polishing head ph is outside of the interference region ‘if’, even if the cleaning brush cb moves towards the center WC of the substrate W, the polishing head ph and the cleaning brush cb do not interfere with each other.

Then, when determining that the polishing head ph has moved out of the interference region ‘if’, the cleaning controller 780 allows the movement of the cleaning brush cb from the position below the outer peripheral end WE of the substrate W to the position opposite to the center WC of the lower surface of the substrate W to start at that time point (step S105). Thus, in the present example, as shown in FIGS. 8A and 8E, the cleaning brush cb starts moving from the position below the outer peripheral end WE of the substrate W to the position opposite to the center WC of the lower surface of the substrate W at the time point t4. In the case where determining that the polishing head ph is within the interference region ‘if’ in the step S104, the cleaning controller 780 repeats the processing of the step S104.

The moving speed at which the cleaning brush cb moves from the position below the outer peripheral end WE of the substrate W to the position opposite to the center WC of the lower surface of the substrate W is adjusted to the second moving speed that has been defined in advance based on the speed information. In the case where the cleaning brush cb moves while being spaced apart from the substrate W, because the substrate W is not scraped by the cleaning brush cb, the moving speed of the cleaning brush cb can be set to a maximum speed. Therefore, the second moving speed is set sufficiently higher than the first moving speed of the polishing head ph when the polishing head ph moves while polishing the lower surface of the substrate W. Thus, as shown in FIGS. 8A and 8F, in the present example, the cleaning brush cb reaches the position opposite to the center WC of the lower surface of the substrate W at the time point t5 preceding the time point t6 at which the polishing head ph reaches the outer peripheral end WE of the substrate W. At this time, the rotation angle 82 of the arm 510 is “γ”.

Next, the cleaning controller 780 allows the cleaning brush cb to be in contact with the lower surface of the substrate W and allows the cleaning brush cb to move towards the outer peripheral end WE of the substrate W (step S106). Specifically, the cleaning brush cb is lifted until coming into contact with the lower surface of the substrate W in a certain time period from the time point t5 of FIG. 8A. The cleaning brush cb is in contact with the lower surface of the substrate W, whereby the center WC of the lower surface of the substrate W is cleaned by the cleaning brush cb. Thereafter, as shown in FIGS. 8G, 8H and 8I, the cleaning brush cb moves onto the outer peripheral end WE of the substrate W, and the lower surface of the substrate W is cleaned by the cleaning brush cb, in a period from the time point t6 to a time point t9. The movement of the cleaning brush cb may start at the same time as the time when the cleaning brush cb comes into contact with the lower surface of the substrate W. During a period from the time point t6 to the time point t9 in which the cleaning brush cb is in contact with the lower surface of the substrate W, the cleaning liquid is supplied from the nozzle 510N to the substrate W. Thus, contaminants stripped off from the lower surface of the substrate W by polishing are cleaned away by the cleaning liquid.

When the cleaning brush cb reaches the outer peripheral end WE of the substrate W at the time point t9, the cleaning brush cb may interfere with the plurality of chuck pins 220. Thus, in the present example, when the cleaning brush cb reaches the outer peripheral end WE of the substrate W, the magnet plate 232B of FIG. 4 temporarily moves from the lower position to the upper position by the magnet lifting lowering mechanism 234B of FIG. 4. Thus, each chuck pin 220 of the spin chuck 200 locally enters the opened state in a region corresponding to the magnet plate 232B. Because the magnet plate 232B is located above the second path pt2 (FIG. 6) of the cleaning brush cb, the cleaning brush cb is prevented from interfering with the plurality of chuck pins 220.

When the polishing head ph reaches the outer peripheral end WE of the substrate W, the cleaning controller 780 allows the polishing head ph to be lowered such that the polishing head ph moves away from the substrate W, and returns the polishing head ph to the head waiting position p1 (step S107). In the present example, as shown in FIGS. 8A, 8G and 8H, the polishing head ph is spaced apart from the substrate W during a period from the time point t6 to the time point t7, and the polishing head ph returns to the head waiting position p1 during a period from the time point t7 to the time point t8.

Further, when the cleaning brush cb reaches the outer peripheral end WE of the substrate W, the cleaning controller 780 allows the cleaning brush cb to be lowered such that the cleaning brush cb moves away from the substrate W, and returns the cleaning brush cb to the brush waiting position p2 (step S108). In the present example, as shown in FIGS. 8A and 8I, the cleaning brush cb is spaced apart from the substrate W during a period from the time point t9 to a time point t10, and the cleaning brush cb returns to the brush waiting position p2 during a period from the time point t10 to a time point t11. Thus, the polish cleaning and the brush cleaning of the lower surface of the substrate W end.

It is not necessary that the steps S106, S107 and S108 of the series of processing of FIG. 7 are performed in the above-mentioned order. The processing of the step S107 may be performed before the step S106. Alternatively, part of the steps S106, S107 and S108 may be performed concurrently with another processing. In the following description, a series of processing of the steps S103, S104 and S105 that are surrounded by a dotted line of the series of processing of FIG. 7 is referred to as an interference prevention basic control.

The cleaning of the upper surface of the substrate W, the polish cleaning of the lower surface of the substrate W and the brush cleaning of the lower surface of the substrate W end, and then the drying processing of the substrate W is performed. In the drying processing of the substrate W, with the substrate W held by all of the chuck pins 220, the substrate W is rotated at a high speed. Thus, the cleaning liquid adhering to the substrate W is shaken off, and the substrate W is dried. The drying processing of the substrate W ends, so that the substrate W is carried out of the casing 710.

In the above-mentioned example, a time point at which the cleaning brush cb starts to be lifted to come into contact with the substrate W is set to the time point t5 at which the cleaning brush cb reaches the position below the center WC of the lower surface of the substrate W. However, the present invention is not limited to this. A time point at which the cleaning brush cb starts to be lifted may be set to the time point t6 at which the polishing head ph reaches the outer peripheral end WE of the substrate W, or may be set at any time point between the time point t5 and the time point t6.

In the above-mentioned example, a time point at which the cleaning brush cb starts moving towards the outer peripheral end WE of the substrate W while performing the brush cleaning is set to the time point t6 at which the polishing head ph reaches the outer peripheral end WE of the substrate W. However, the present invention is not limited to this. A time point at which the cleaning brush cb starts moving towards the outer peripheral end WE of the substrate W may be set to a time point at which the cleaning brush cb comes into contact with the center WC of the substrate W by being lifted, or may be set to any time point during a period from the time when the cleaning brush cb comes into contact with the substrate W to the time point t6. In this case, on the lower surface of the substrate W, polish cleaning of an annular region by the polishing head ph is simultaneously performed with the brush cleaning of another region further inward than the annular region by the cleaning brush cb.

Figure 9:
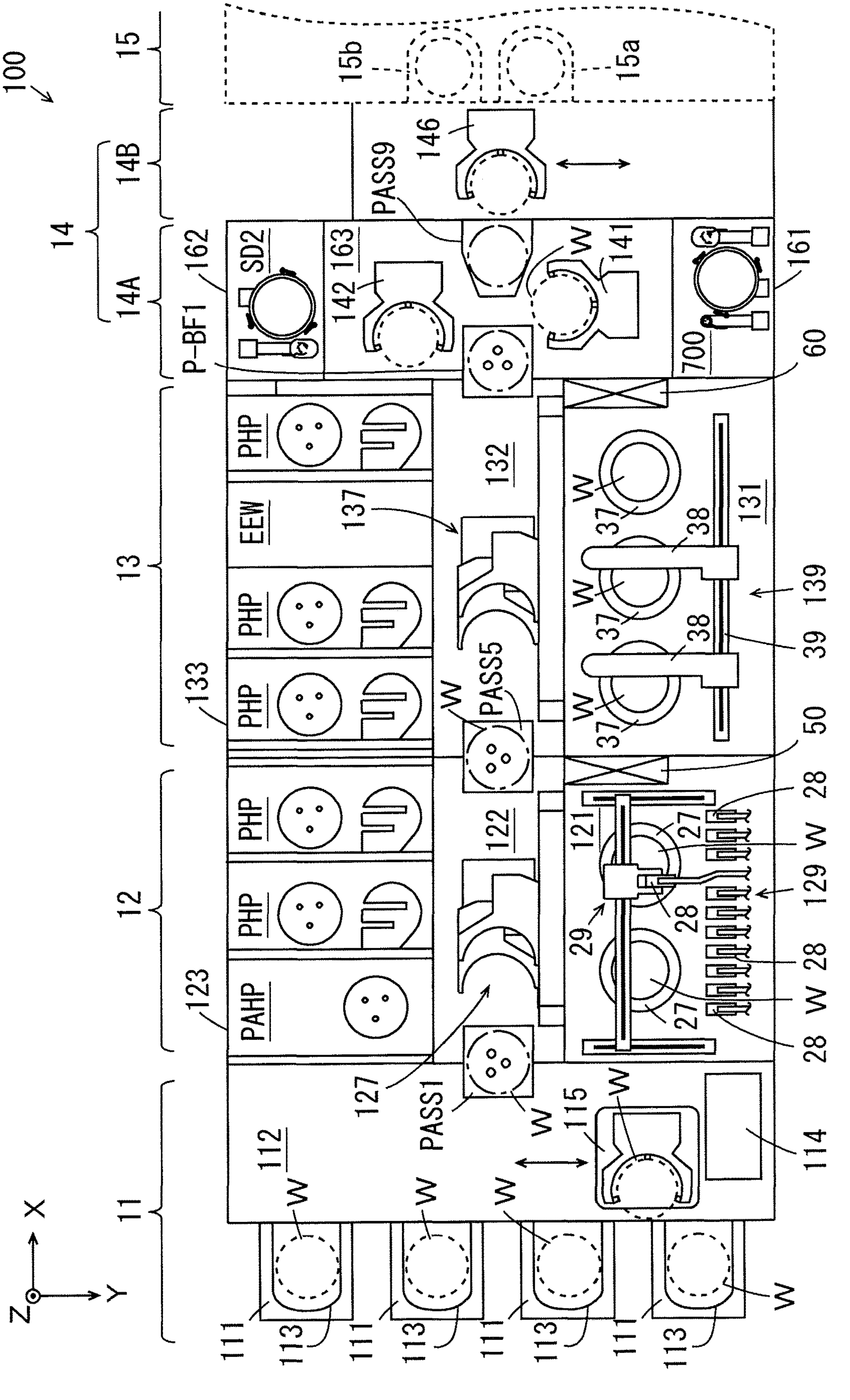
FIG. 9 is a schematic plan view of a substrate processing apparatus including the substrate cleaning device of FIG. 1.
Figure 10:
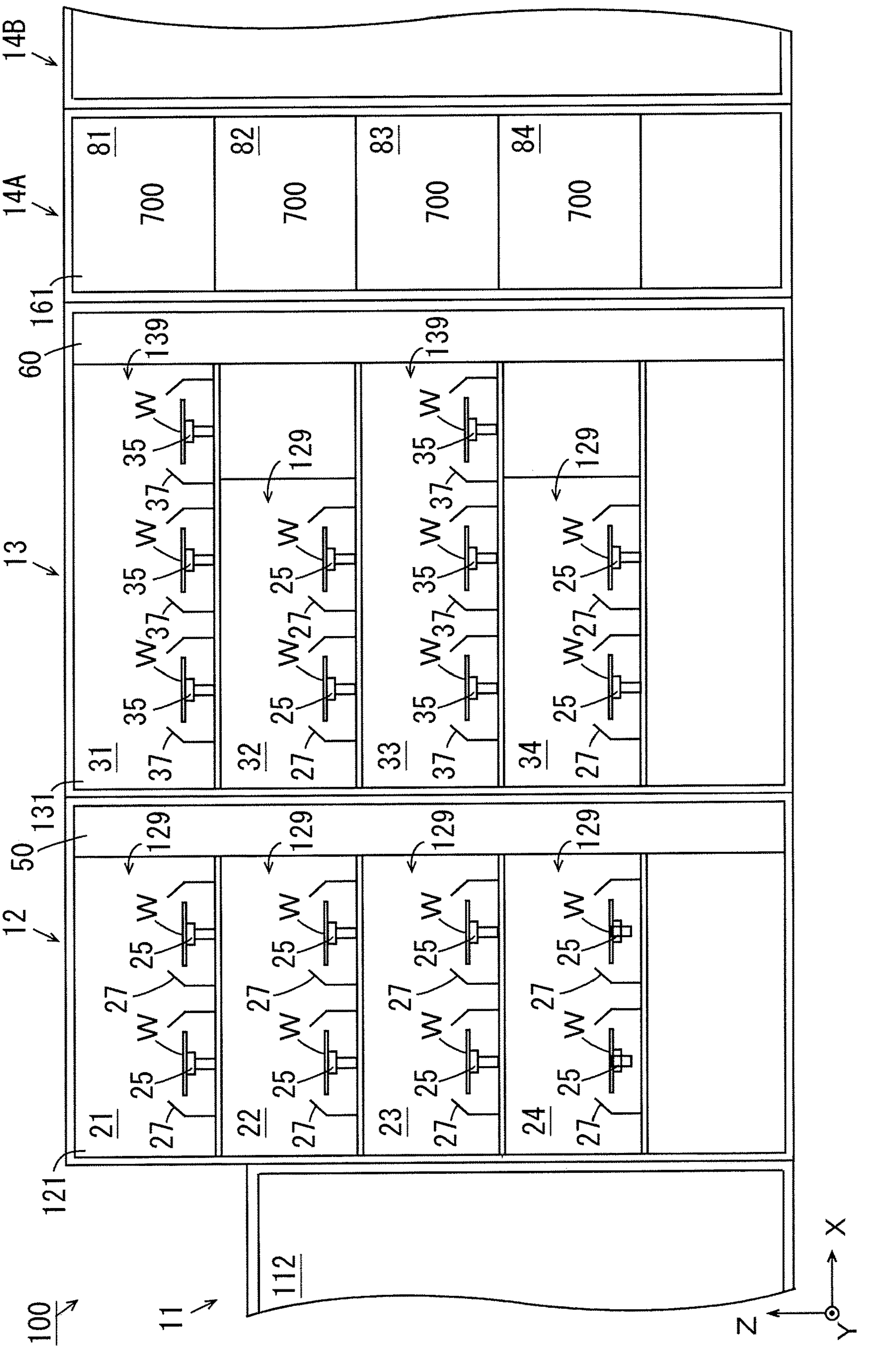
FIG. 10 is a schematic side view of the substrate processing apparatus mainly showing a coating processing section, a coating development processing section and a cleaning drying processing section of FIG. 9.
Figure 11:
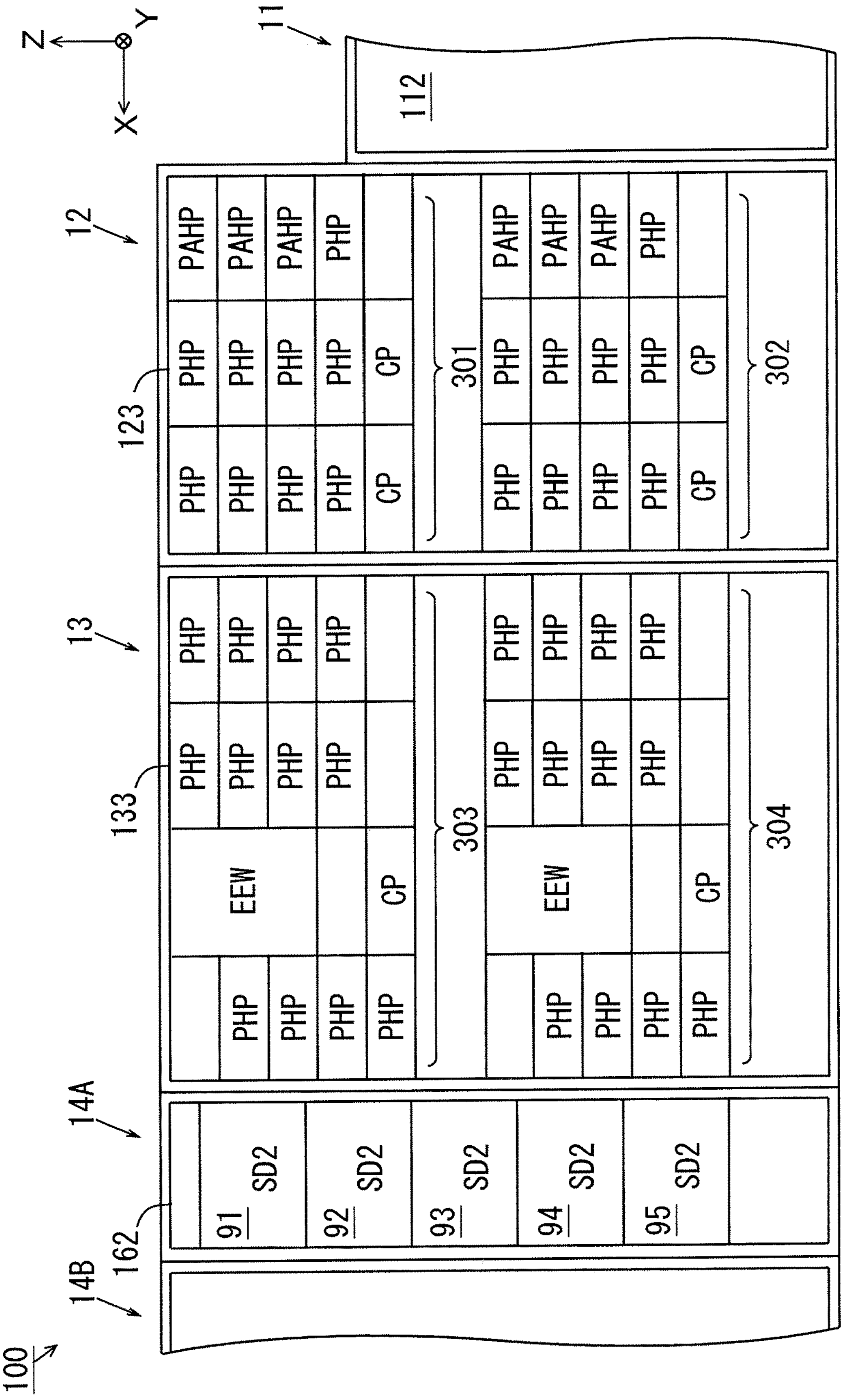
FIG. 11 is a schematic side view of the substrate processing apparatus mainly showing thermal processing sections and a cleaning drying processing section of FIG. 9.
Figure 12:
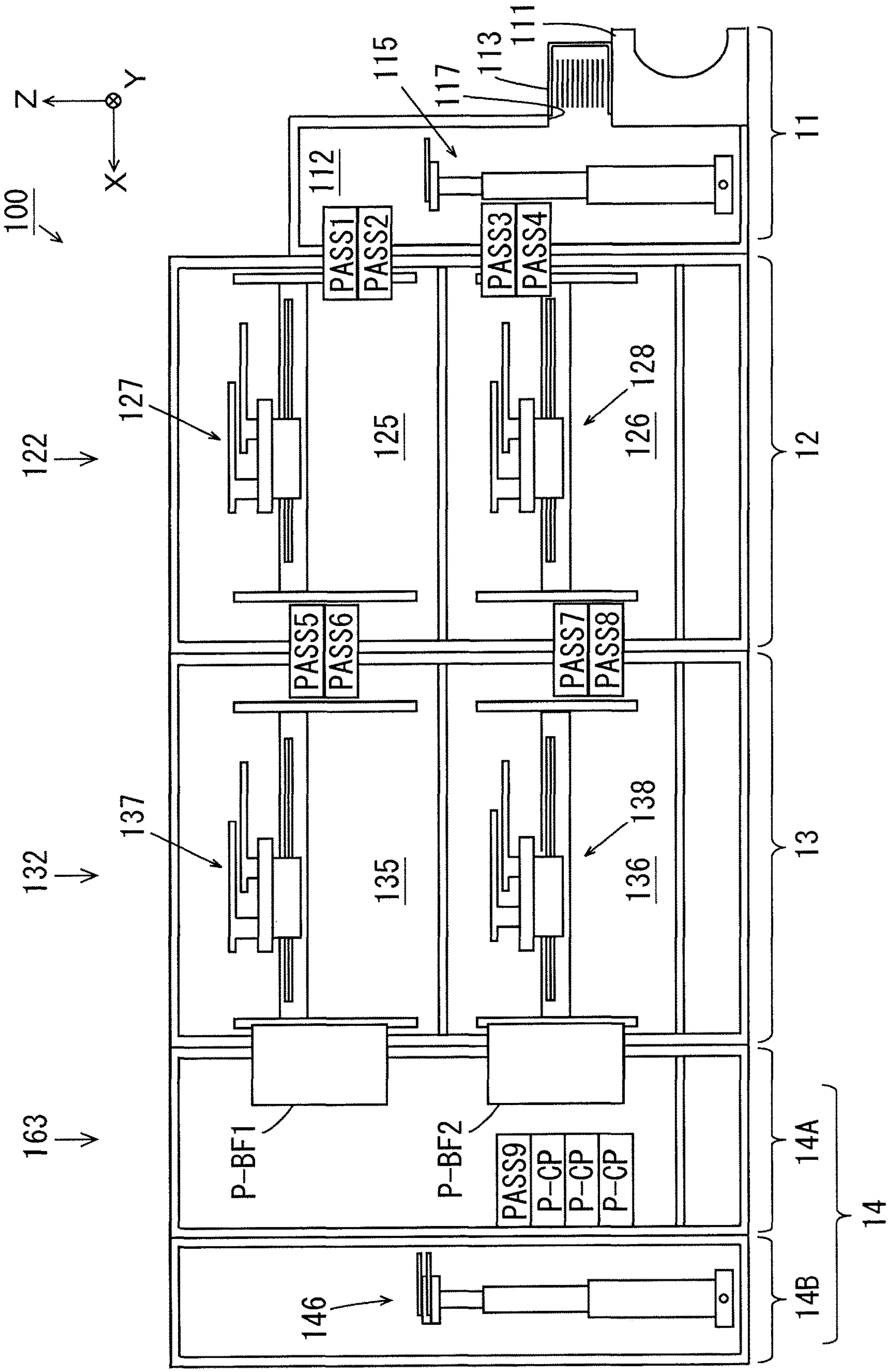
FIG. 12 is a side view mainly showing transport sections of FIG. 9.

[6] Substrate Processing Apparatus (a) Outline of Configuration of Substrate Processing Apparatus FIG. 9 is a schematic plan view of the substrate processing apparatus including the substrate cleaning device 700 of FIG. 1. FIG. 9 and the subsequent given drawings FIGS. 10 to 12 are accompanied by the arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 9, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

The indexer block 11 includes a plurality of carrier platforms 111 and a transport section 112. In each carrier platform 111, a carrier 113 for storing the plurality of substrates W in multiple stages is placed.

In the transport section 112, a main controller 114 and a transport device 115 are provided. The main controller 114 controls various constituent elements of the substrate processing apparatus 100. The transport device 115 holds and transports the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. A substrate platform PASS1 and below-mentioned substrate platforms PASS2 to PASS4 (see FIG. 12) on which the substrates W are placed are provided between the transport section 122 and the indexer block 11. A transport device 127 and a below-mentioned transport device 128 (see FIG. 12), which transport the substrates W, are provided in the transport section 122.

The second processing block 13 includes a coating development processing section 131, a transport section 132 and a thermal processing section 133. The coating development processing section 131 and the thermal processing section 133 are provided to be opposite to each other with the transport section 132 interposed therebetween. A substrate platform PASS5 and below-mentioned substrate platforms PASS6 to PASS8 (see FIG. 12) on which the substrates W are placed, are provided between the transport section 132 and the transport section 122. A transport device 137 and a below-mentioned transport device 138 (see FIG. 12), which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport devices 141, 142 are provided in the transport section 163.

A placement buffer unit P-BF1 and a below-mentioned placement buffer unit P-BF2 (see FIG. 12) are provided between the transport section 163 and the transport section 132.

Further, a substrate platform PASS9 and below-mentioned placement cooling units P-CP (see FIG. 12) are provided to be adjacent to the carry-in carry-out block 14B between the transport devices 141, 142.

A transport device 146 is provided in the carry-in carry-out block 14B. The transport device 146 carries in the substrate W to and carries out the substrate W from the exposure device 15. A substrate inlet 15*a* for carrying in the substrate W and a substrate outlet 15*b* for carrying out the substrate W are provided in the exposure device 15.

(b) Configurations of Coating Processing Section and Coating Development Processing Section FIG. 10 is a schematic side view of the substrate processing apparatus 100 mainly showing the coating processing section 121, the coating development processing section 131 and the cleaning drying processing section 161 of FIG. 9.

As shown in FIG. 10, the coating processing section 121 has coating processing chambers 21, 22, 23, 24 provided in a stack. Each of the coating processing chambers 21 to 24 is provided with a coating processing unit (a spin coater) 129. The coating development processing section 131 has development processing chambers 31, 33 and coating processing chambers 32, 34 provided in a stack. Each of the development processing chambers 31, 33 is provided with a development processing unit (a spin developer) 139, and each of the coating processing chambers 32, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two pairs of the spin chuck 25 and the cup 27. The spin chuck 25 is driven to be rotated by a driving device (an electric motor, for example) that is not shown. Further, as shown in FIG. 9, each coating processing unit 129 includes a plurality of processing liquid nozzles 28 for discharging a processing liquid and a nozzle transport mechanism 29 for transporting the processing liquid nozzles 28.

In the coating processing unit 129, each of the spin chucks 25 is rotated by a driving device (not shown), and any processing liquid nozzle 28 of the plurality of processing liquid nozzles 28 is moved to a position above the substrate W by the nozzle transport mechanism 29, and the processing liquid is discharged from the processing liquid nozzle 28. Thus, the processing liquid is applied onto the substrate W. Further, a rinse liquid is discharged to the peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28. In the coating processing unit 129 in each of the coating processing chambers 32, 34, a processing liquid for a resist cover film is supplied to the substrate W from the processing liquid nozzle 28.

Similarly to the coating processing unit 129, the development processing unit 139 includes spin chucks 35 and cups 37. Further, as shown in FIG. 9, the development processing unit 139 includes two development nozzles 38 that discharge a development liquid and a moving mechanism 39 that moves the development nozzles 38 in the X direction.

In the development processing unit 139, the spin chuck 35 is rotated by a driving device (not shown), and one development nozzle 38 supplies the development liquid to each substrate W while being moved in the X direction. Thereafter, the other development nozzle 38 supplies the development liquid to each substrate W while being moved. In this case, the development processing for the substrate W is performed by the supply of the development liquid to the substrate W. Further, in the present embodiment, development liquids different from each other are discharged from the two development nozzles 38. Thus, two types of development liquids can be supplied to each substrate W.

In the cleaning drying processing section 161, cleaning drying processing chambers 81, 82, 83, 84 are provided in a stack. In each of the cleaning drying processing chambers 81 to 84, the substrate cleaning device 700 of FIG. 1 is provided. In the substrate cleaning device 700, the cleaning of the upper surface, the polish cleaning of the lower surface, the brush cleaning of the lower surface, and drying processing for the substrate W on which the exposure processing has not been performed are performed.

The cleaning controllers 780 of the plurality of substrate cleaning devices 700 provided in the cleaning drying processing section 161 may be provided in an upper portion of the cleaning drying processing section 161 as local controllers. Alternatively, the main controller 114 of FIG. 9 may perform each type of processing performed by the cleaning controllers 780 of the plurality of substrate cleaning devices 700.

As shown in FIGS. 9 and 10, a fluid box 50 is provided in the coating processing section 121 to be adjacent to the coating development processing section 131. Similarly, a fluid box 60 is provided in the coating development processing section 131 to be adjacent to the cleaning drying processing block 14A. The fluid box 50 and the fluid box 60 each house fluid related elements such as a pipe, a joint, a valve, a flowmeter, a regulator, a pump, a temperature adjuster used to supply a processing liquid and a development liquid to the coating processing units 129 and the development processing units 139 and discharge the liquid and air and the like out of the coating processing units 129 and the development processing units 139.

(c) Configuration of Thermal Processing Sections

FIG. 11 is a schematic side view of the substrate processing apparatus 100 mainly showing the thermal processing sections 123, 133 and the cleaning drying processing section 162 of FIG. 9. As shown in FIG. 11, the thermal processing section 123 has an upper thermal processing section 301 provided above and a lower thermal processing section 302 provided below. A plurality of thermal processing devices PHP, a plurality of adhesion reinforcement processing units PAHP and a plurality of cooling units CP are provided in each of the upper thermal processing section 301 and the lower thermal processing section 302.

Heating processing for the substrate W is performed in each thermal processing device PHP. In each adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. A cooling unit CP, a plurality of thermal processing devices PHP and an edge exposure unit EEW are provided in each of the upper thermal processing section 303 and the lower thermal processing section 304.

In the edge exposure unit EEW, exposure processing (edge exposure processing) is performed on a region having a constant width at the peripheral portion of the resist film formed on the substrate W. In each of the upper thermal processing section 303 and the lower thermal processing section 304, each thermal processing device PHP provided to be adjacent to the cleaning drying processing block 14A is configured to be capable of receiving the substrate W carried in from the cleaning drying processing block 14A.

In the cleaning drying processing section 162, cleaning drying processing chambers 91, 92, 93, 94, 95 are provided in a stack. In each of the cleaning drying processing chambers 91 to 95, a cleaning drying processing unit SD2 is provided. Each cleaning drying processing unit SD2 has the same configuration as the substrate cleaning device 700 except that the substrate polishing mechanism 400 is not provided and the magnet plates 231A, 231B, 232A of FIG. 4 are integrally provided. In the cleaning drying processing unit SD2, cleaning of the upper surface, brush cleaning of the lower surface, and drying processing for the substrate W on which the exposure processing has been performed are performed.

(d) Configuration of Transport Sections

FIG. 12 is a side view mainly showing the transport sections 122, 132, 163 of FIG. 9. As shown in FIG. 12, the transport section 122 has an upper transport chamber 125 and a lower transport chamber 126. The transport section 132 has an upper transport chamber 135 and a lower transport chamber 136. The upper transport chamber 125 is provided with the transport device (transport robot) 127, and the lower transport chamber 126 is provided with the transport device 128. Further, the upper transport chamber 135 is provided with the transport device 137, and the lower transport chamber 136 is provided with the transport device 138.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The transport device 127 is configured to be capable of transporting the substrates W among the substrate platforms PASS1, PASS2, PASS5, PASS6, the coating processing chambers 21, 22 (FIG. 10) and the upper thermal processing section 301 (FIG. 11). The transport device 128 is configured to be capable of transporting the substrates W among the substrate platforms PASS3, PASS4, PASS7, PASS8, the coating processing chambers 23, 24 (FIG. 10) and the lower thermal processing section 302 (FIG. 11).

The transport device 137 is configured to be capable of transporting the substrates W among the substrate platforms PASS5, PASS6, the placement buffer unit P-BF1, the development processing chamber 31 (FIG. 10), the coating processing chamber 32 (FIG. 10) and the upper thermal processing section 303 (FIG. 11). The transport device 138 is configured to be capable of transporting the substrates W among the substrate platforms PASS7, PASS8, the placement buffer unit P-BF2, the development processing chamber 33 (FIG. 10), the coating processing chamber 34 (FIG. 10) and the lower thermal processing section 304 (FIG. 11).

The transport device 141 (FIG. 9) of the transport section 163 is configured to be capable of transporting the substrate W among the placement cooling unit P-CP, the substrate platform PASS9, the placement buffer units P-BF1, P-BF2 and the cleaning drying processing section 161 (FIG. 10).

The transport device 142 (FIG. 9) of the transport section 163 is configured to be capable of transporting the substrate W among the placement cooling unit P-CP, the substrate platform PASS9, the placement buffer units P-BF1, P-BF2, the cleaning drying processing section 162 (FIG. 11), the upper thermal processing section 303 (FIG. 11) and the lower thermal processing section 304 (FIG. 11).

(e) Operation of Substrate Processing Apparatus

The operation of the substrate processing apparatus 100 will be described with reference to FIGS. 9 to 12. The carriers 113 in which the unprocessed substrates W are stored are placed on the carrier platforms 111 (FIG. 9) in the indexer block 11. The transport device 115 transports the unprocessed substrate W from the carrier 113 to each of the substrate platforms PASS1, PASS3 (FIG. 12). Further, the transport device 115 transports the processed substrate W that is placed on each of the substrate platforms PASS2, PASS4 (FIG. 12) to the carrier 113.

In the first processing block 12, the transport device 127 (FIG. 12) sequentially transports the substrate W placed on the substrate platform PASS1 to the adhesion reinforcement processing unit PAHP (FIG. 11), the cooling unit CP (FIG. 11) and the coating processing chamber 22 (FIG. 10). Next, the transport device 127 sequentially transports the substrate W on which the anti-reflection film is formed by the coating processing chamber 22 to the thermal processing device PHP (FIG. 11), the cooling unit CP (FIG. 11) and the coating processing chamber 21 (FIG. 10). Then, the transport device 127 sequentially transports the substrate W on which the resist film is formed by the coating processing chamber 21 to the thermal processing device PHP (FIG. 11) and the substrate platform PASS5 (FIG. 12).

In this case, the adhesion reinforcement processing is performed on the substrate W in the adhesion reinforcement processing unit PAHP, and then the substrate W is cooled to a temperature suitable for formation of the anti-reflection film in the cooling unit CP. Next, the anti-reflection film is formed on the substrate W by the coating processing unit 129 (FIG. 10) in the coating processing chamber 22. Subsequently, the thermal processing for the substrate W is performed in the thermal processing device PHP, and then the substrate W is cooled in the cooling unit CP to a temperature suitable for the formation of the resist film. Next, in the coating processing chamber 21, the resist film is formed on the substrate W by the coating processing unit 129 (FIG. 10). Thereafter, the thermal processing for the substrate W is performed in the thermal processing device PHP, and the substrate W is placed on the substrate platform PASS5.

Further, the transport device 127 transports the substrate W on which the development processing has been performed and which is placed on the substrate platform PASS6 (FIG. 12) to the substrate platform PASS2 (FIG. 12).

The transport device 128 (FIG. 12) sequentially transports the substrate W placed on the substrate platform PASS3 to the adhesion reinforcement processing unit PAHP (FIG. 11), the cooling unit CP (FIG. 11) and the coating processing chamber 24 (FIG. 10). Then, the transport device 128 sequentially transports the substrate W on which the anti-reflection film is formed by the coating processing chamber 24 to the thermal processing device PHP (FIG. 11), the cooling unit CP (FIG. 11) and the coating processing chamber 23 (FIG. 10). Subsequently, the transport device 128 sequentially transports the substrate W on which the resist film is formed by the coating processing chamber 23 to the thermal processing device PHP (FIG. 11) and the substrate platform PASS7 (FIG. 12).

Further, the transport device 128 (FIG. 12) transports the substrate W on which the development processing has been performed and which is placed on the substrate platform PASS8 (FIG. 12) to the substrate platform PASS4 (FIG. 12). The processing contents for the substrate W in each of the coating processing chambers 23, 24 (FIG. 10) and the lower thermal processing section 302 (FIG. 11) are similar to the processing contents for the substrate W in each of the coating processing chambers 21, 22 (FIG. 10) and the upper thermal processing section 301 (FIG. 11) that are described above.

In the second processing block 13, the transport device 137 (FIG. 12) sequentially transports the substrate W on which the resist film is formed and which is placed on the substrate platform PASS5 to the coating processing chamber 32 (FIG. 10), the thermal processing device PHP (FIG. 11), the edge exposure unit EEW (FIG. 11) and the placement buffer unit P-BF1 (FIG. 12). In this case, in the coating processing chamber 32, the resist cover film is formed on the substrate W by the coating processing unit 129 (FIG. 10). Thereafter, the thermal processing is performed on the substrate W in the thermal processing device PHP, and the substrate W is carried into the edge exposure unit EEW. Subsequently, in the edge exposure unit EEW, the edge exposure processing is performed on the substrate W. The substrate W on which the edge exposure processing has been performed is placed on the placement buffer unit P-BF1.

Further, the transport device 137 (FIG. 12) takes out the substrate W, on which the exposure processing has been performed by the exposure device 15 and on which the thermal processing has been performed, from the thermal processing device PHP (FIG. 11) that is adjacent to the cleaning drying processing block 14A. The transport device 137 sequentially transports the substrate W to the cooling unit CP (FIG. 11), the development processing chamber 31 (FIG. 10), the thermal processing device PHP (FIG. 11) and the substrate platform PASS6 (FIG. 12).

In this case, the substrate W is cooled to a temperature suitable for the development processing in the cooling unit CP. Then, the resist cover film is removed, and the development processing for the substrate W is performed, by the development processing unit 139 in the development processing chamber 31. Thereafter, the thermal processing for the substrate W is performed in the thermal processing device PHP, and the substrate W is placed on the substrate platform PASS6.

The transport device 138 (FIG. 12) sequentially transports the substrate W on which the resist film is formed and which is placed on the substrate platform PASS7 to the coating processing chamber 34 (FIG. 10), the thermal processing device PHP (FIG. 11), the edge exposure unit EEW (FIG. 11) and the placement buffer unit P-BF2 (FIG. 12).

Further, the transport device 138 (FIG. 12) takes out the substrate Won which the exposure processing has been performed by the exposure device 15 and the thermal processing have been performed from the thermal processing device PHP (FIG. 11) that is adjacent to the cleaning drying processing block 14A. The transport device 138 sequentially transports the substrate W to the cooling unit CP (FIG. 11), the development processing chamber 33 (FIG. 10), the thermal processing device PHP (FIG. 11) and the substrate platform PASS8 (FIG. 12). The processing contents for the substrate W in the development processing chamber 33, the coating processing chamber 34 and the lower thermal processing section 304 are similar to the processing contents for the substrate W in the development processing chamber 31, the coating processing chamber 32 (FIG. 10) and the upper thermal processing section 303 (FIG. 11) that are described above.

In the cleaning drying processing block 14A, the transport device 141 (FIG. 9) transports the substrate W that is placed on each of the placement buffer units P-BF1, P-BF2 (FIG. 12) to the substrate cleaning device 700 (FIG. 10) in the cleaning drying processing section 161. Then, the transport device 141 transports the substrate W from the substrate cleaning device 700 to the placement cooling unit P-CP (FIG. 12). In this case, cleaning of the upper surface, polish cleaning of the lower surface, brush cleaning of the lower surface and drying processing for the substrate W are performed in the substrate cleaning device 700, and then the substrate W is cooled in the placement cooling unit P-CP to a temperature suitable for the exposure processing in the exposure device 15 (FIG. 9).

The transport device 142 (FIG. 9) transports the substrate W on which the exposure processing has been performed and which is placed on the substrate platform PASS9 (FIG. 12) to the cleaning drying processing unit SD2 (FIG. 11) in the cleaning drying processing section 162. Further, the transport device 142 transports the substrate W on which the cleaning and drying processing have been performed to the thermal processing device PHP (FIG. 11) in the upper thermal processing section 303 or the thermal processing device PHP (FIG. 11) in the lower thermal processing section 304 from the cleaning drying processing unit SD2. In this thermal processing device PHP, post-exposure bake (PEB) processing is performed.

In the carry-in carry-out block 14B, the transport device 146 (FIG. 9) transports the substrate W on which the exposure processing has not been performed and which is placed on the placement cooling unit P-CP (FIG. 12) to the substrate inlet 15*a* (FIG. 9) of the exposure device 15. Further, the transport device 146 (FIG. 9) takes out the substrate W on which the exposure processing has been performed from the substrate outlet 15*b* (FIG. 9) of the exposure device 15, and transports the substrate W to the substrate platform PASS9 (FIG. 12).

In the case where the exposure device 15 cannot receive the substrate W, the substrate W on which the exposure processing has not been performed is temporarily stored in each of the placement buffer units P-BF1, P-BF2. Further, in the case where the development processing unit 139 (FIG. 10) in the second processing block 13 cannot receive the substrate W on which the exposure processing has been performed, the substrate W on which the exposure processing has been performed is temporarily stored in each of the placement buffer units P-BF1, P-BF2.

In the above-mentioned substrate processing apparatus 100, processing for the substrate W in the coating processing chambers 21, 22, 32, the development processing chamber 31 and the upper thermal processing sections 301, 303 that are provided above, and the processing for the substrate W in the coating processing chambers 23, 24, 34, the development processing chamber 33 and the lower thermal processing sections 302, 304 that are provided below can be concurrently performed. Thus, it is possible to improve throughput without increasing a footprint.

Here, a main surface of the substrate W refers to a surface on which the anti-reflection film, the resist film and the resist cover film are formed, and the back surface of the substrate W refers to a surface of the substrate W on the opposite side of the main surface. Inside of the substrate processing apparatus 100 according to the present embodiment, each type of the above-mentioned processing is performed on the substrate W with the main surface of the substrate W directed upward, that is, each type of processing is performed on the upper surface of the substrate W.

[7] Effects (a) As described above, in the substrate cleaning device 700 according to the present embodiment, the polishing cleaning of the lower surface of the substrate W is performed by the polishing head ph of the substrate polishing mechanism 400, and the brush cleaning of the lower surface of the substrate W is performed by the cleaning brush cb of the substrate cleaning mechanism 500.

The polishing head ph moves from the center WC of the substrate W towards the outer peripheral end WE of the substrate W during the polish cleaning of the substrate W, and it is determined whether the polishing head ph has moved out of the interference region 'if'. At a time point at which the polishing head ph moves out of the interference region 'if', the movement of the cleaning brush cb from the outer peripheral end WE of the substrate W towards the center WC of the substrate W starts. In this case, because the polishing head ph is outside of the interference region 'if', even if the polishing head ph and the cleaning brush cb move simultaneously, the polishing head ph and the cleaning brush cb do not interfere with each other. Therefore, it is possible to prevent the polishing head ph and the cleaning brush cb from interfering with each other without a complicated setting operation regarding the movement of the polishing head ph and the cleaning brush cb.

Further, because the cleaning brush cb starts moving towards the center WC of the substrate W before the polishing head ph that is performing the polish cleaning reaches the outer peripheral end WE of the substrate W, a period from the time when the polish cleaning by the polishing head ph starts until the time when the cleaning brush cb reaches the center WC of the substrate W can be shortened. Therefore, the brush cleaning of the substrate W by the cleaning brush cb can be quickly performed after the polish cleaning or during the polish cleaning of the substrate W by the polishing head ph.

As a result, a complicated setting operation for preventing interference regarding the operations of the polishing head ph and the cleaning brush cb is not required, and it is possible to improve cleanliness of the substrate W while inhibiting a reduction in throughput.

(b) In the above-mentioned example, the second moving speed at which the cleaning brush cb moves from the outer peripheral end WE of the substrate W to the center WC of the substrate W is higher than the first moving speed at which the polishing head ph moves from the center WC to the outer peripheral end WE of the substrate W. Thus, the cleaning brush cb can move to the center WC of the substrate W in a short period of time from a time point at which the polishing head ph moves out of the interference region 'if'.

(c) In the above-mentioned example, the speed at which the polishing head ph moves from the outer peripheral end WE to the center WC of the substrate W is higher than the first moving speed at which the polishing head ph moves from the center WC towards the outer peripheral end WE of the substrate W. Further, the second speed at which the cleaning brush cb moves from the outer peripheral end WE towards the center WC of the substrate W is higher than the speed at which the cleaning brush cb moves from the center WC towards the outer peripheral end WE of the substrate W. Thus, the polishing head ph and the cleaning brush cb located at the outer peripheral end WE of the substrate W can move to the center WC of the substrate W in a short period of time.

(d) In the above-mentioned example, the polishing head ph is spaced apart from the lower surface of the substrate W during a period in which the polishing head ph moves from the outer peripheral end WE of the substrate W towards the center WC of the substrate W, and the polishing head ph is in contact with the lower surface of the substrate W during a period in which the polishing head ph moves from the center WC of the substrate W towards the outer peripheral end WE of the substrate W. Further, the cleaning brush cb is spaced apart from the lower surface of the substrate W during a period in which the cleaning brush cb moves from the outer peripheral end WE of the substrate W towards the center WC of the substrate W, and the cleaning brush cb is in contact with the lower surface of the substrate W during a period in which the cleaning brush cb moves from the center WC of the substrate W towards the outer peripheral end WE of the substrate W.

In this case, the polish cleaning of the lower surface of the substrate W is performed by the polishing head ph during a period in which the polishing head ph moves from the center WC of the substrate W towards the outer peripheral end WE of the substrate W. The contaminants, which have been removed by the polishing head ph during the polish cleaning, flow towards the outer peripheral end WE of the substrate W by a centrifugal force. Thus, the removed contaminants are prevented from flowing towards the center WC of the substrate W from the polishing head ph.

Further, the brush cleaning of the lower surface of the substrate W is performed by the cleaning brush cb during a period in which the cleaning brush cb moves from the center WC of the substrate W towards the outer peripheral end WE of the substrate W. The contaminants, which have been removed by the cleaning brush cb during the brush cleaning, flow towards the outer peripheral end WE of the substrate W by a centrifugal force. Thus, the removed contaminants are prevented from flowing towards the center WC of the substrate W from the cleaning brush cb.

Further, because the brush cleaning is performed on a portion, of the substrate Won which the polish cleaning has been performed by the polishing head ph, by the cleaning brush cb, the contaminants generated due to the polishing of the lower surface of the substrate W are removed by the cleaning brush cb. As a result, the cleanliness of the substrate W that has been cleaned by the polishing head ph and the cleaning brush cb is more sufficiently improved.

(e) In the substrate processing apparatus 100, the lower surface of the substrate W on which the exposure processing has not been performed is polished and cleaned by the substrate cleaning device 700. Thus, an occurrence of processing defects in the substrate W caused by the contamination of the lower surface of the substrate W can be inhibited with no increase in manufacturing cost of the substrate W.

[8] Other Embodiments (a) While the second moving speed stored in the cleaning controller 780 as the speed information is set higher than the first moving speed in the above-mentioned embodiment, the first and second moving speeds may be set equal to each other depending on the method of cleaning the substrate W. Alternatively, the second moving speed may be set lower than the first moving speed.

In the case where the second moving speed is equal to or lower than the first moving speed, a time period in which the cleaning brush cb moves from the outer peripheral end WE to the center WC of the substrate W is prolonged. Therefore, the cleaning brush cb preferably starts moving from the outer peripheral end WE to the center WC of the substrate W at an earlier time point.

In the case where the second moving speed is equal to or lower than the first moving speed, even in the case where a time point at which the polishing head ph starts moving from the center WC of the substrate W to the outer peripheral end WE of the substrate W, and a time point at which the cleaning brush cb starts moving from the outer peripheral end WE to the center WC of the substrate W are the same, it is considered that the polishing head ph and the cleaning head cb are unlikely to interfere with each other. Thus, the cleaning controller 780 may perform the following processing instead of the processing of FIG. 7.

Figure 13:
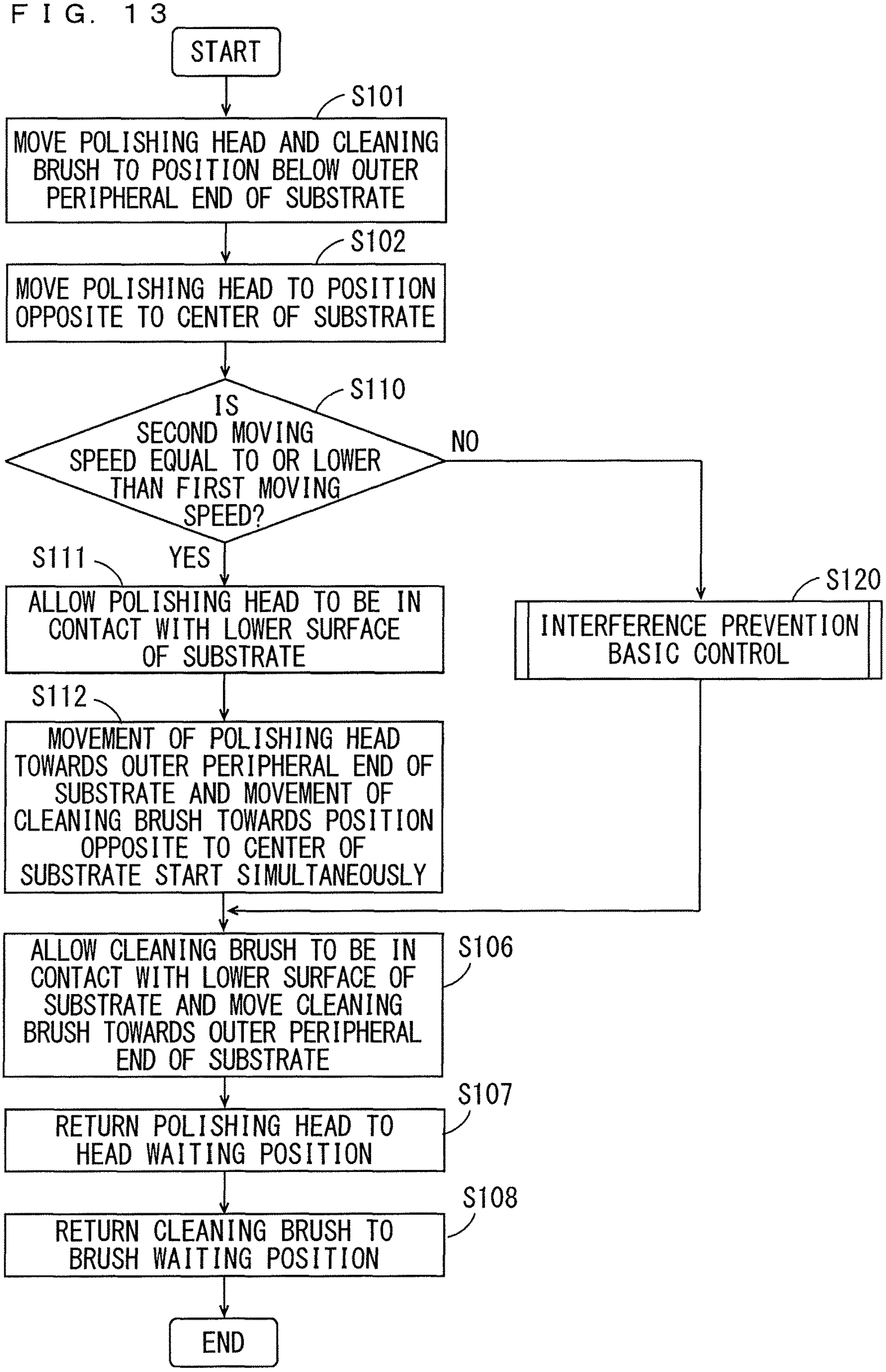
FIG. 13 is a flow chart showing a control operation of a cleaning controller according to another embodiment.

FIG. 13 is a flow chart showing a control operation of the cleaning controller 780 according to another embodiment. As shown in FIG. 13, in the case where performing the polish cleaning and the brush cleaning of the lower surface of the substrate W, similarly to the example of FIG. 7 in the above-mentioned embodiment, the cleaning controller 780 first moves the polishing head ph and the cleaning brush cb to the positions below the outer peripheral end WE of the substrate W (step S101). The cleaning controller 780 further moves the polishing head ph to the position opposite to the center WC of the substrate W while holding the cleaning brush cb at the position below the outer peripheral end WE of the substrate W (step S102).

Subsequently, the cleaning controller 780 determines whether the second moving speed is equal to or lower than the first moving speed based on the speed information stored in the speed information storage 786 (step S110). In the case where the second moving speed is not equal to or lower than the first moving speed, the cleaning controller 780 performs the interference prevention basic control including the processing of the steps S103 to S105 of FIG. 7 (step S120), and performs the processing of the subsequent step S106.

On the other hand, in the case where the second moving speed is equal to or lower than the first moving speed, the cleaning controller 780 allows the polishing head ph to be in contact with the lower surface of the substrate W (step S111). Further, the cleaning controller 780 allows the movement of the polishing head ph from the center WC of the substrate W towards the outer peripheral end WE of the substrate W, and the movement of the cleaning brush cb from the position below the outer peripheral end WE of the substrate W towards the position opposite to the center WC of the lower surface of the substrate W to start simultaneously (step S112).

Thereafter, similarly to the example of FIG. 7 of the above-mentioned embodiment, the cleaning controller 780 allows the cleaning brush cb to be in contact with the lower surface of the substrate W and allows the cleaning brush cb to move towards the outer peripheral end WE of the substrate W (step S106). Further, when the polishing head ph reaches the outer peripheral end WE of the substrate W, the cleaning controller 780 allows the polishing head ph to be lowered and move away from the substrate W, and returns the polishing head ph to the head waiting position p1 (step S107). Further, when the cleaning brush cb reaches the outer peripheral end WE of the substrate W, the cleaning controller 780 allows the cleaning brush cb to be lowered and move away from the substrate WE, and returns the cleaning brush cb to the brush waiting position p2 (step S108).

In this manner, in the control example of FIG. 13, in the case where the second moving speed is equal to or lower than the first moving speed, the movement of the cleaning brush cb from the outer peripheral end WE of the substrate W towards the center WC of the substrate W can start at an earlier time point according to the method of cleaning the substrate W. Therefore, the cleaning brush cb can move to the center WC of the substrate W in a short period of time from a time point at which the movement of the polishing head ph from the center WC to the outer peripheral end WE of the substrate W starts.

Figure 14:
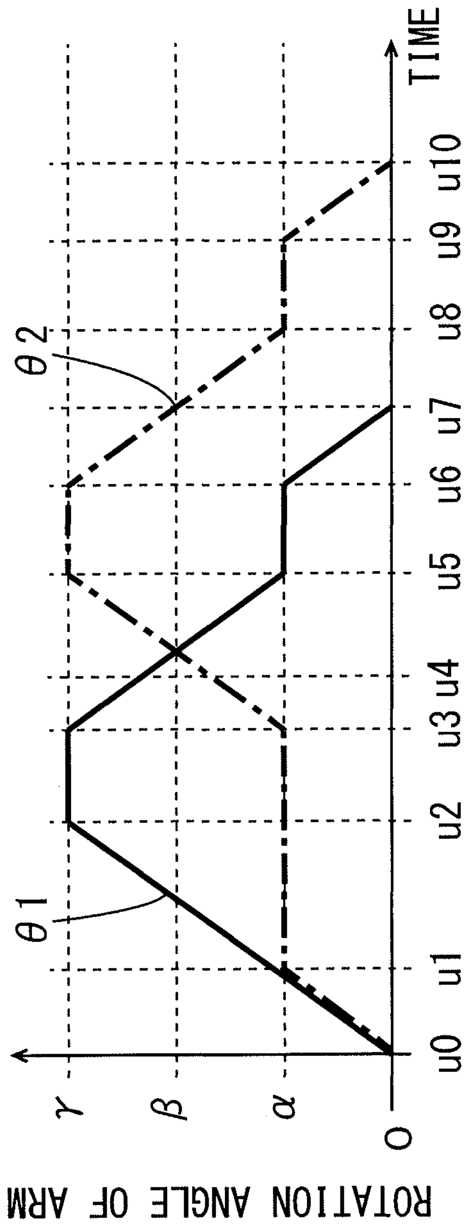
FIG. 14 is a diagram showing one example of an operation of an arm when the substrate polishing mechanism and the substrate cleaning mechanism are controlled according to a control example of FIG. 13.
Figure 15:
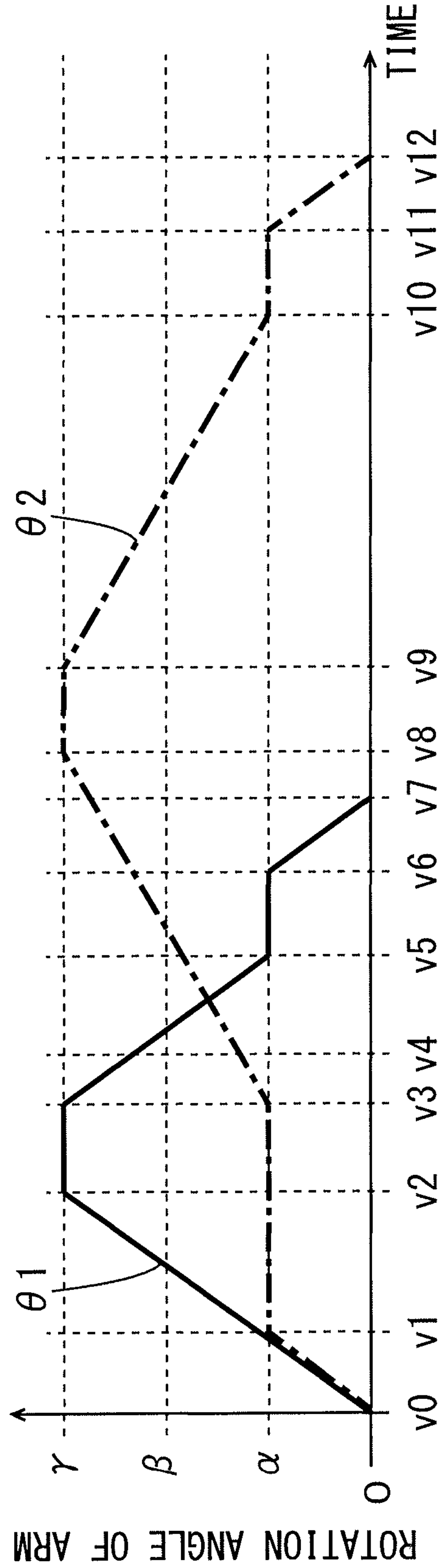
FIG. 15 is a diagram showing another example of an operation of the arm when the substrate polishing mechanism and the substrate cleaning mechanism are controlled according to the control example of FIG. 13.

FIG. 14 is a diagram showing one example of operations of the arms 410, 510 when the substrate polishing mechanism 400 and the substrate cleaning mechanism 500 are controlled in accordance with the control example of FIG. 13. FIG. 15 is a diagram showing another example of the operations of the arms 410, 510 when the substrate polishing mechanism 400 and the substrate cleaning mechanism 500 are controlled in accordance with the control example of FIG. 13.

In FIGS. 14 and 15, the changes of the rotation angles θ1, 02 of the arms 410, 510 are indicated in time charts. In each of the time charts of FIGS. 14 and 15, a thick solid line indicates the change of the rotation angle θ1 of the arm 410, and a thick one-dot and dash line indicates the change of the rotation angle θ2 of the arm 510.

In the example of FIG. 14, the first moving speed and the second moving speed are set equal to each other. Similarly to a period from the time point t0 to the time point t2 of FIG. 8A, the polishing head ph moves to the center WC of the substrate W, and the cleaning brush cb moves to the outer peripheral end WE of the substrate W, during a period from a time point u0 to a time point u2. Thereafter, at a time point u3, the movement of the polishing head ph from the center WC of the substrate W towards the outer peripheral end WE of the substrate W, and the movement of the cleaning brush cb from a position below the outer peripheral end WE of the substrate W towards a position opposite to the center WC of the lower surface of the substrate W start simultaneously in the processing of the steps S110 to S112 of FIG. 13. Thus, the cleaning brush cb reaches the center WC of the substrate W at the same time as the time when the polishing head ph reaches the outer peripheral end WE of the substrate W at the time point u5.

In the example of FIG. 15, the second moving speed is set lower than the first moving speed. Similarly to a period from the time point t0 to the time point t2 of FIG. 8A, the polishing head ph moves to the center WC of the substrate W, and the cleaning brush cb moves to the outer peripheral end WE of the substrate W, during a period from a time point v0 to a time point v2. Thereafter, at a time point v3, the movement of the polishing head ph from the center WC of the substrate W towards the outer peripheral end WE of the substrate W, and the movement of the cleaning brush cb from a position below the outer peripheral end WE of the substrate W to a position opposite to the center WC of the lower surface of the substrate W start simultaneously in the processing of the steps S110 to S112 of FIG. 13. Thus, the polishing head ph reaches the outer peripheral end WE of the substrate W at the time point v5, and then the cleaning brush cb reaches the center WC of the substrate W at a time point v8 without requirement of an excessively long period of time.

(b) In the above-mentioned embodiment, the position determiner 794 is provided in the polish cleaning controller 790, and the position determiner is not provided in the brush cleaning controller 795. However, the present invention is not limited to this. The position determiner may be provided in the brush cleaning controller 795.

In this case, in the case where the cleaning brush cb of the substrate polishing mechanism 400 moves from the center WC of the substrate W to the outer peripheral end WE of the substrate W, and the polishing head ph of the substrate cleaning mechanism 500 moves from the outer peripheral end WE of the substrate W to the center WC of the substrate W, for example, the substrate polishing mechanism 400 can be controlled based on output of the encoder provided in the substrate polishing mechanism 400 and a result of determination of the position determiner of the brush cleaning controller 795. Thus, even in the case where the brush cleaning and the polish cleaning are performed in this order, the control method of FIGS. 7 and 13 can be applied.

(c) While the substrate cleaning device 700 is configured to be capable of polishing the lower surface of the substrate W in the above-mentioned embodiment, the present invention is not limited to this. The substrate cleaning device 700 may be configured to be capable of polishing the upper surface of the substrate W. For example, the substrate cleaning device 700 may include a spin chuck that holds the lower surface of the substrate W by suction instead of the above-mentioned spin chuck 200, a mover for the polishing head ph that moves the polishing head ph between the center WC and the outer peripheral end WE of the substrate W while allowing the polishing head ph to be in contact with the upper surface of the substrate W rotated by the spin chuck, and a mover for the cleaning brush cb that moves the cleaning brush cb between the center WC and the outer peripheral end WE of the substrate W while allowing the cleaning brush cb to be in contact with the upper surface of the substrate W rotated by the spin chuck.

(d) While the polishing head ph and the cleaning brush cb are provided as the configurations for cleaning the substrate W while being in contact with the lower surface of the substrate W in the substrate cleaning device 700 in the above-mentioned embodiment, the present invention is not limited to this.

In the substrate cleaning device 700, a polishing head ph may be provided at the arm 510 of the substrate cleaning mechanism 500 instead of the cleaning brush cb. In this case, flexibility of the polish cleaning of the substrate W is improved with use of two polishing heads ph fabricated of materials that are different from each other, for example.

Alternatively, in the substrate cleaning device 700, a cleaning brush cb may be provided at the arm 410 of the substrate polishing mechanism 400 instead of the polishing head ph. In this case, flexibility of the brush cleaning of the substrate W is improved with use of two cleaning brushes cb fabricated of materials that are different from each other, for example.

(e) While the two configurations (the substrate polishing mechanism 400 and the substrate cleaning mechanism 500) for cleaning the lower surface of the substrate W are provided in the substrate cleaning device 700 in the above-mentioned embodiment, the present invention is not limited to this. Three or more configurations for cleaning the lower surface of the substrate W may be provided in the substrate cleaning device 700. Also in this case, an interference region is defined, and position information with respect to the interference region is stored in the cleaning controller 780, whereby the control method of FIGS. 7 and 13 can be applied based on the position information.

(f) While the polishing head ph performs the polish cleaning on the lower surface of the substrate W only when moving from the center WC to the outer peripheral end WE of the substrate W in the above-mentioned embodiment, the present invention is not limited to this. The polishing head ph may perform the polish cleaning on the lower surface of the substrate W when moving from the outer peripheral end WE to the center WC of the substrate W.

(g) While the cleaning brush cb performs the brush cleaning on the lower surface of the substrate W only when moving from the center WC to the outer peripheral end WE of the substrate W in the above-mentioned embodiment, the present invention is not limited to this. The cleaning brush cb may perform the brush cleaning on the lower surface of the substrate W when moving from the outer peripheral end WE to the center WC of the substrate W.

(h) While pure water is used as the cleaning liquid in the above-mentioned embodiment, a chemical liquid such as BHF (Buffered Hydrofluoric Acid), DHF (Dilute Hydrofluoric Acid), Hydrofluoric Acid, Hydrochloric Acid, Sulfuric Acid, Nitric Acid, Phosphoric Acid, Acetic Acid, Oxalic Acid, Ammonia or the like may be used as the cleaning liquid instead of pure water. More specifically, a mixed solution of ammonia water and hydrogen peroxide water may be used as the cleaning liquid, and an alkaline solution such as TMAH (Tetramethylammonium hydroxide) may be used as the cleaning liquid.

(i) While the exposure device 15 that performs the exposure processing for the substrate W by a liquid immersion method is provided as an external device of the substrate processing apparatus 100 in the above-mentioned embodiment, the present invention is not limited to this. The exposure device that performs the exposure processing for the substrate W with no liquid may be provided as an external device of the substrate processing apparatus 100. In this case, in the coating processing unit 129 in each of the coating processing chambers 32, 34, the resist cover film does not have to be formed on the substrate W. Therefore, the coating processing chambers 32, 34 can be used as development processing chambers.

(j) While the substrate processing apparatus 100 according to the above-mentioned embodiment is a substrate processing apparatus (so-called coater and developer) that performs the coating forming processing of the resist film and the development processing on the substrate W, the substrate processing apparatus provided with the substrate cleaning device 700 is not limited to the above-mentioned example. The present invention may be applied to a substrate processing apparatus that performs single processing such as cleaning processing and the like on the substrate W. For example, the substrate processing apparatus according to the present invention may be constituted by an indexer block that includes a transport device, a substrate platform and the like, and one or a plurality of substrate cleaning devices 700.

[9] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the spin chuck 200 is an example of a rotation holder, the lower surface of the substrate W is an example of one surface and a lower surface of the substrate, the polishing head ph is an example of a first cleaner, the cleaning brush cb is an example of a second cleaner, the first path pt1 is an example of a first path, and the arm 410 and the arm support post 420 of the substrate polishing mechanism 400 and the inner configurations of the arm support post 420 are examples of a first mover.

Further, the second path pt2 is an example of a second path, the arm 510 and the arm support post 520 of the substrate cleaning mechanism 500 and the inner configurations of the arm support post 520 are examples of a second mover, the first trajectory Ic1 is an example of a trajectory of a first cleaner, and the second trajectory Ic2 is an example of a trajectory of a second cleaner.

Further, the interference region 'if' is an example of an interference region, the position information is an example of position information, the position information storage 785 of the cleaning controller 780 is an example of a storage, the arm controller 793, the position determiner 794 and the brush cleaning controller 795 of the cleaning controller 780 are examples of a controller, the substrate cleaning device 700 is an example of a substrate cleaning device, the polishing head ph is an example of a polisher, the cleaning brush cb is an example of a brush, the first moving speed is an example of a first moving speed, and the second moving speed is an example of a second moving speed.

Further, the exposure device 15 is an example of an exposure device, the substrate processing apparatus 100 is an example of a substrate processing apparatus, the coating processing unit 129 that supplies the processing liquid for the resist film to the substrate W is an example of a coating device, and the transport devices 115, 127, 128, 137, 138, 141, 142, 146 are examples of a transport device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for a cleaning device that cleans one surface of a substrate.

We claim:

1. A substrate cleaning device comprising:

a rotation holder that holds and rotates a substrate;

first and second cleaners configured to be capable of being in contact with one surface of the substrate;

a first mover that moves the first cleaner along a first path that extends to pass through a center of the substrate and an outer periphery of the substrate while allowing the first cleaner to be in contact with the one surface of the substrate rotated by the rotation holder, and includes an encoder that outputs a signal corresponding to a position of the first cleaner on the first path;

a second mover that moves the second cleaner along a second path that extends to pass through the center of the substrate and the outer periphery of the substrate while allowing the second cleaner to be in contact with the one surface of the substrate rotated by the rotation holder;

a storage configured to store position information, the position information indicating the position of the first cleaner at a time point at which the first cleaner, which moves from the center of the substrate towards the outer periphery of the substrate, moves out of an interference region where a trajectory of the first cleaner extending along the first path and a trajectory of the second cleaner extending along the second path overlap with each other; and a CPU programmed to control the first mover such that the first cleaner moves from the center of the substrate towards the outer periphery of the substrate, determine whether the first cleaner has moved out of the interference region based on the signal output from the encoder and based on the position information from the storage, and control the second mover such that the second cleaner starts moving from the outer periphery of the substrate towards the center of the substrate at a time point at which it is determined that the first cleaner has moved out of the interference region.

2. The substrate cleaning device according to claim 1, wherein the CPU is further programmed to control the first and second movers such that a speed at which the second cleaner moves from the outer periphery of the substrate towards the center of the substrate is higher than a speed at which the first cleaner moves from the center of the substrate towards the outer periphery of the substrate.

3. The substrate cleaning device according to claim 1, wherein the CPU is further programmed to control the first mover such that the first cleaner is spaced apart from the one surface of the substrate during a period in which the first cleaner moves from the outer periphery of the substrate to the center of the substrate, control the first mover such that the first cleaner is in contact with the one surface of the substrate during a period in which the first cleaner moves from the center of the substrate towards the outer periphery of the substrate, control the second mover such that the second cleaner is spaced apart from the one surface of the substrate during a period in which the second cleaner moves from the outer periphery of the substrate towards the center of the substrate, and control the second mover such that the second cleaner is in contact with the one surface of the substrate during a period in which the second cleaner moves from the center of the substrate to the outer periphery of the substrate.

4. The substrate cleaning device according to claim 1, wherein the CPU is further programmed to control the first and second movers such that a speed at which the first cleaner moves from the outer periphery of the substrate towards the center of the substrate is higher than a speed at which the first cleaner moves from the center of the substrate towards the outer periphery of the substrate, and a speed at which the second cleaner moves from the outer periphery of the substrate towards the center of the substrate is higher than a speed at which the second cleaner moves from the center of the substrate towards the outer periphery of the substrate.

5. The substrate cleaning device according to claim 1, wherein the first cleaner is a polisher, and the second cleaner is a brush.

6. The substrate cleaning device according to claim 1, wherein a first region and a second region are defined to be divided by a virtual line passing through a rotation center of the substrate held by the rotation holder, the first mover further includes a first arm configured to rotate in a plane parallel to the one surface of the substrate about a first axis positioned in the first region in first and second rotational directions that are opposite to each other, the second mover further includes a second arm configured to rotate in a plane parallel to the one surface of the substrate about a second axis positioned in the second region in the first and second rotational directions, the first cleaner is provided at the first arm such that the first cleaner moves from the center of the substrate to the outer periphery of the substrate in the first region by the rotation of the first arm in the first rotational direction, and the second cleaner is provided at the second arm such that the second cleaner moves from the outer periphery of the substrate in the second region to the center of the substrate by the rotation of the second arm in the first rotational direction.

7. A substrate processing apparatus arranged to be adjacent to an exposure device, comprising:

a spin coater that applies a photosensitive film to an upper surface of a substrate;

the substrate cleaning device according to claim 1; and a transport robot that transports the substrate among the spin coater, the substrate cleaning device and the exposure device, wherein the substrate cleaning device removes contaminants from a lower surface that is used as the one surface of the substrate before exposure processing for the substrate by the exposure device.

8. A substrate cleaning device comprising:

a rotation holder that holds and rotates a substrate;

first and second cleaners configured to be capable of being in contact with one surface of the substrate;

a first mover that moves the first cleaner along a first path that extends to pass through a center of the substrate and an outer periphery of the substrate while allowing the first cleaner to be in contact with the one surface of the substrate rotated by the rotation holder;

a second mover that moves the second cleaner along a second path that extends to pass through the center of the substrate and the outer periphery of the substrate while allowing the second cleaner to be in contact with the one surface of the substrate rotated by the rotation holder;

a storage configured to store position information, the position information indicating a position of the first cleaner at a time point at which the first cleaner, which moves from the center of the substrate towards the outer periphery of the substrate, moves out of an interference region where a trajectory of the first cleaner extending along the first path and a trajectory of the second cleaner extending along the second path overlap with each other; and a CPU programmed to perform a first control that controls the first mover such that the first cleaner moves from the center of the substrate towards the outer periphery of the substrate at a first moving speed, and perform a second control that controls the second mover such that the second cleaner moves from the outer periphery of the substrate towards the center of the substrate at a second moving speed, the CPU is further programmed to determine whether the first moving speed is equal to or higher than the second moving speed before performing the first and second controls, in the case where the first moving speed is lower than the second moving speed, determine whether the first cleaner has moved out of the interference region based on the position information after starting the first control, and then start the second control at a time point at which the CPU has determined that the first cleaner has moved out of the interference region, in the case where the first moving speed is equal to or higher than the second moving speed, simultaneously start the first and second controls such that movement of the first cleaner from the center of the substrate towards the outer periphery of the substrate and movement of the second cleaner from the outer periphery of the substrate towards the center of the substrate are simultaneously started, and not determine whether the first cleaner has moved out of the interference region.

* * * * *